United States Patent
Choi et al.

(10) Patent No.: US 8,659,966 B2
(45) Date of Patent: Feb. 25, 2014

(54) METHOD COMPENSATION OPERATING VOLTAGE, FLASH MEMORY DEVICE, AND DATA STORAGE DEVICE

(75) Inventors: Yoon Hee Choi, Hwaseong-si (KR); Ki Tae Park, Seongnam-si (KR); Bo Geun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 198 days.

(21) Appl. No.: 13/235,695

(22) Filed: Sep. 19, 2011

(65) Prior Publication Data

US 2012/0134213 A1 May 31, 2012

(30) Foreign Application Priority Data

Nov. 25, 2010 (KR) ........................ 10-2010-0117950

(51) Int. Cl.
*G11C 7/00* (2006.01)
(52) U.S. Cl.
USPC .................... 365/211; 365/185.18; 365/185.2
(58) Field of Classification Search
USPC ................................. 365/211, 185.18, 185.2
See application file for complete search history.

(56) References Cited

U.S. PATENT DOCUMENTS

| 7,187,610 | B1 * | 3/2007 | McCollum et al. | 365/222 |
| 7,492,657 | B2 * | 2/2009 | Sako | 365/222 |
| 7,768,811 | B2 * | 8/2010 | Matsuno et al. | 365/145 |
| 2010/0090748 | A1 | 4/2010 | Ito | |
| 2010/0110815 | A1 | 5/2010 | Lee et al. | |

FOREIGN PATENT DOCUMENTS

| JP | 2010-098050 | 4/2010 |
| KR | 1020090124101 A | 12/2009 |
| KR | 1020100049924 A | 5/2010 |

* cited by examiner

*Primary Examiner* — Son Dinh
(74) *Attorney, Agent, or Firm* — Volentine & Whitt, PLLC

(57) ABSTRACT

Disclosed is a method generating a compensated operating voltage, such as a read voltage, in a non-volatile memory device, and a related non-volatile memory device. The operating voltage is compensated in response to one or more memory cell conditions such as temperature variation, programmed data state or physical location of a selected memory cell, page information for selected memory cell, or the location of a selected word line.

31 Claims, 22 Drawing Sheets

METHOD COMPENSATION OPERATING VOLTAGE, FLASH MEMORY DEVICE, AND DATA STORAGE DEVICE

CROSS-REFERENCE TO RELATED APPLICATIONS

This application claims the benefit under 35 U.S.C §119 of Korean Patent Application No. 10-2010-0117950 filed Nov. 25, 2010, the subject matter of which is hereby incorporated by reference.

BACKGROUND OF THE INVENTION

Embodiments of the inventive concept relate to semiconductor memory devices, and more particularly, to flash memory devices and data storage devices incorporating same.

Semiconductor memories are important microelectronic components in digital logic systems, such as computers and microprocessor-based applications ranging from satellites to consumer electronics. Advances in the fabrication of semiconductor memories including process enhancements and technology developments enable scaling that provides greater integration density and faster operating speeds. Improvements in semiconductor memories further enable performance of incorporating digital logic systems.

Semiconductor memory devices may be classified according to their operative nature as being either volatile or non-volatile. Volatile memory devices enjoy relatively fast operating characteristics, but lose stored data in the absence of applied power. Volatile memory devices include random access memories (RAMs) that store data either by setting up the logic state of a bi-stable flip-flop, as in a static random access memory (SRAM), or by charging a capacitor, as in a dynamic random access memory (DRAM).

Non-volatile memories do lose stored data in the absence of applied power, and include, as examples, Mask Read-Only Memory (MROM), Programmable Read-Only Memory (PROM), Erasable Programmable Read-Only Memory (EPROM), and Electrically Erasable Programmable Read-Only Memory (EEPROM). Data storage for a non-volatile memory may be a one-time use or reprogrammable use depending on the technology used to fabricate the memory device. Non-volatile memories are used to store microcode in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain additional logic circuitry that optimizes performance for specific application tasks.

Within the broader class of non-volatile memories, the MROM, PROM, and EPROM are not capable of being freely erased and written to using normally available system resources. Thus, they are not practically suitable for use in many applications. In contrast, the EEPROM is capable of being electrically erased or written. Hence, the EEPROM has been widely adopted for use within many different applications including auxiliary memories, frequently updated memory components, etc. Flash memory is a common form of the EEPROM and includes NAND type and NOR type flash memory.

SUMMARY OF THE INVENTION

In one embodiment, the inventive concept provides a method generating an operating voltage in a non-volatile memory device including a memory cell array of non-volatile memory cells, the method comprising; detecting at least one memory cell condition including a current temperature for the non-volatile memory device, generating the operating voltage to be applied to a selected memory cell in the memory cell array, and compensating the operating voltage in response to the at least one memory cell condition.

In another embodiment, the inventive concept provides a method generating an operating voltage in a memory system comprising a non-volatile memory device including an operating voltage generator, and a memory cell array of non-volatile memory cells, the method comprising; storing trim information in a trim information region of the memory cell array, wherein the trim information comprises voltage trim information, upon powering-up the non-volatile memory device and using the trim voltage information, configuring at least one lookup table storing a plurality of compensating offset values, detecting a current temperature for the non-volatile memory device, after receiving an access command initiating execution of an access operation by the non-volatile memory device, generating a compensated operating voltage by selecting an offset value from the plurality of compensating offset values stored in the at least one lookup table in response to the current temperature, and performing the access operation using the compensated operating voltage.

In another embodiment, the inventive concept provides a non-volatile memory device comprising; control logic that controls operation of the non-volatile memory device, a memory cell array of nonvolatile memory cells, and an operating voltage generator that generates a compensated operating voltage to be applied to a selected memory cell in the memory cell array, wherein the operating voltage generator comprises; a temperature code generator that detects a current temperature and generates a corresponding temperature code, a first lookup table that stores a plurality of first offset values that respectively correspond to a plurality of temperature ranges, and a second lookup table that stores a plurality of second offset values that respectively correspond to variations in a memory cell condition. The control logic selects one of the first offset values in response to the temperature code and one of the second offset values in response to a determined variation in the memory cell condition, and the operating voltage generator generates the compensated operating voltage in response to the first offset value and the second offset value.

In another embodiment, the inventive concept provides a memory card comprising; at least one non-volatile memory device, a controller including a buffer memory and configured to control the non-volatile memory device, and an interface providing an interface between the controller and an external device. The at least one non-volatile memory device comprises; control logic that controls operation of the non-volatile memory device, a memory cell array of nonvolatile memory cells, and an operating voltage generator that generates a compensated operating voltage to be applied to a selected memory cell in the memory cell array, wherein the operating voltage generator comprises; a temperature code generator that detects a current temperature and generates a corresponding temperature code, a first lookup table that stores a plurality of first offset values that respectively correspond to a plurality of temperature ranges, and a second lookup table that stores a plurality of second offset values that respectively correspond to variations in a memory cell condition, wherein the control logic selects one of the first offset values in response to the temperature code and one of the second offset values in response to a determined variation in the memory cell condition, and the operating voltage generator generates the compensated operating voltage in response to the first offset value and the second offset value.

In another embodiment, the inventive concept provides a solid state drive (SSD) comprising; storage media including a plurality of non-volatile memory devices, and a controller connected with the storage media via a plurality of channels and configured to control the storage media. At least one of the plurality of non-volatile memory devices comprises; control logic that controls operation of the non-volatile memory device, a memory cell array of nonvolatile memory cells, and an operating voltage generator that generates a compensated operating voltage to be applied to a selected memory cell in the memory cell array, wherein the operating voltage generator comprises; a temperature code generator that detects a current temperature and generates a corresponding temperature code, a first lookup table that stores a plurality of first offset values that respectively correspond to a plurality of temperature ranges, and a second lookup table that stores a plurality of second offset values that respectively correspond to variations in a memory cell condition, wherein the control logic selects one of the first offset values in response to the temperature code and one of the second offset values in response to a determined variation in the memory cell condition, and the operating voltage generator generates the compensated operating voltage in response to the first offset value and the second offset value.

BRIEF DESCRIPTION OF THE DRAWINGS

The above and other objects and features will become apparent from the description that follows and that references to the attached drawings. Throughout the written description and drawings, like reference numbers and labels are used to demote like or similar elements and features.

DETAILED DESCRIPTION

Figure 1:
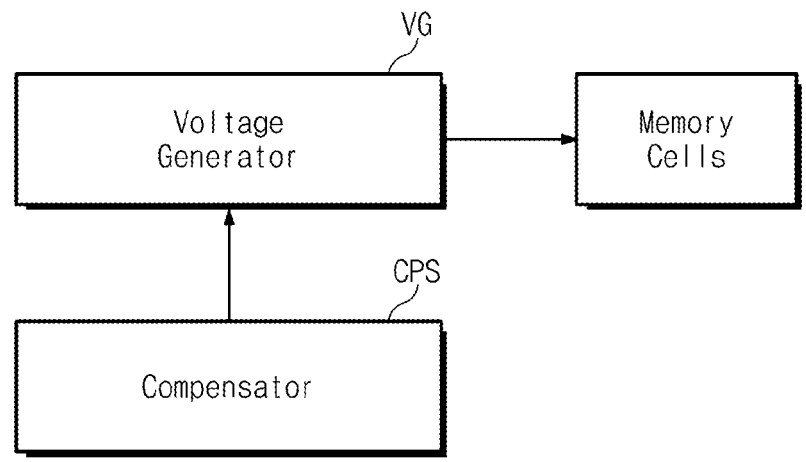
FIG. 1 is a block diagram generally illustrating voltage compensation according to an embodiment of the inventive concept.

Embodiments of the inventive concept will now be described in some additional detail with reference to the accompanying drawings. The inventive concept may, however, be embodied in many different forms and should not be construed as being limited to only the illustrated embodiments. Rather, the embodiments are provided so that the disclosure will be thorough and complete, and will fully convey the scope of the inventive concept to those skilled in the art.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure (FIG.) 1 is a block diagram conceptually describing a voltage compensation method according to an embodiment of the inventive concept.

Referring to FIG. 1, a voltage compensating method may be applied within the context of embodiments of the inventive concept to semiconductor memory devices, and non-volatile memory devices in particular. Such non-volatile memory devices may include single-level, non-volatile memory cells (SLC) capable of storing a single bit of data and/or multi-level, non-volatile memory cells (MLC) capable of storing two or more bits of data. Each memory cell may be formed of a cell transistor having a threshold voltage or resistance range that varies with data states (or programmed data states). The memory cells of the non-volatile memory device are typically arranged in rows (i.e., along word lines) and columns (i.e., along bit lines), and such arrangements may be configured in a two-dimensional structure or a three-dimensional structure.

As illustrated in FIG. 1, a non-volatile memory device according to an embodiment of the inventive concept comprises a voltage generator circuit VG and a compensator circuit CPS. The voltage generator circuit VG may be configured to generate voltages to be supplied to memory cells such as a word line voltage, a well voltage, and the like. The compensator circuit CPS may compensate a voltage from the voltage generator circuit VG so as to be changed according to various conditions at a temperature variation. For example, threshold voltages/resistances of memory cells may be changed in accordance with variations in the operating temperature of the constituent non-volatile memory device. If an operating voltage applied to the memory cells (e.g., a word line voltage) is fixed regardless of temperature variation, it may become difficult to accurately determine the threshold voltages of memory cells.

The compensator circuit CPS according to certain embodiments of the inventive concept will compensate one or more voltages provided by the voltage generator circuit VG to the memory cells (hereafter, singularly or collectively referred to as the "operating voltage") so as to automatically adjust the nature (e.g., the level) of the operating voltage as a function of temperature variation. Alternately or additionally, the compensator circuit CPS according to certain embodiments of the inventive concept will compensate the operating voltage so as to adjust its nature as a function of "memory cell condition" (e.g., the program state of a selected memory cell, the physical location of a selected word line, a temperature region for a current temperature, the page information of a selected memory cell, etc.). One or more of these memory cell conditions may be used to control the voltage compensation of the operating voltage provided by the voltage generator circuit VG. In the foregoing context, the term "memory cell condition" encompasses not only those memory system factors directly associated with a selected memory cell (e.g., location in the memory cell array), but also memory system factors indirectly associated with a selected memory cell (e.g., supply voltage or word line location).

Certain memory cell conditions may be fixed relative to a given memory system configuration and/or pre-set memory system operating definitions (e.g., selected memory cell location within the memory cell array, program state for the selected memory cell, page information for the selected memory cell, etc.). Other memory cell conditions may be variable (e.g., memory system temperature, supply voltage, and other environmental factors).

Thus, the migration or shift in the threshold voltage/resistance of a non-volatile memory cell due to temperature variation may necessitate a compensating shift in the operating voltage applied to a selected memory cell in order to accurately determine the threshold voltage of the memory cell. Thus, a "compensating shift" of the operating voltage may be made in view of temperature variation only, temperature and certain fixed and/or variable memory cell conditions, etc. In this context, the term "shift" refers to any change in temperature or operating voltage regardless of change period or mode of change over the change period. In this manner, it is possible to more accurately determine the threshold voltage of memory cells by properly applying a compensating shift to the operating voltage in response to at least a change in temperature.

It should be noted at this point, that a temperature variation or an actual temperature may be variously detected using direct or indirect methods. That is, one or more internal and/or external temperature sensors may be used in conjunction with a memory cell array, a constituent substrate, a peripheral circuit, etc. Calculated or deterministic methodologies may be used to estimate or approximate an actual temperature based on relevant empirical or real-time information (e.g., a number and/or type of executed operations, voltage conditions, operating frequency, etc.).

FIGS. 2A, 2B, 2C and 2D are conceptual diagrams that illustrate various conditions potentially causing a shift in the threshold voltage distribution of a memory cell.

Figure 2A:
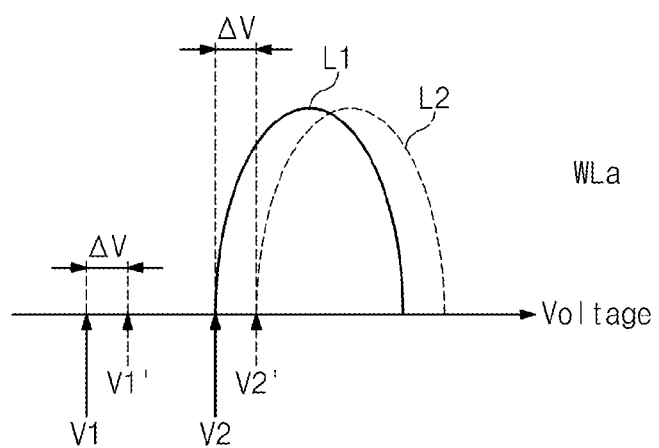
FIGS. 2A through 2D are conceptual diagrams describing various conditions that cause variations in a threshold voltage distribution of a non-volatile memory cell.

Referring to FIG. 2A, it is assumed that a memory cell connected to a word line WLa is a programmed to a defined logic state Pi. Under nominal temperature conditions, memory cells programmed to state Pi should have a threshold voltage distribution indicated by line L1. With these assumptions, the threshold voltage distribution L1 may be readily discriminated during a normal read operation using a read voltage V1, and during a verification (read) operation using a verification read voltage V2. The voltages V1 and V2 are provided by the voltage generator circuit VG of FIG. 1.

However, under non-nominal temperature conditions, the nominal (i.e., intended by memory system design) threshold voltage distribution L1 shifts to a threshold voltage distribution L2 illustrated by dotted line L2. Under these conditions, the compensator circuit CPS according to an embodiment of the inventive concept will apply compensating shifts through the voltage generator circuit VG such that the read voltages V1 and V2—which are respective examples of an operating voltage—are changed in accordance with the change in temperature. That is, the read voltage V1 is increased by $\Delta V$ to V1' and the verification voltage V2 is also increased by $\Delta V$ to V2'. Hence, in certain embodiments of the inventive concept, the application of a compensating shift to an operating voltage or operating voltages may be made proportionally with temperature variation.

Figure 2B:
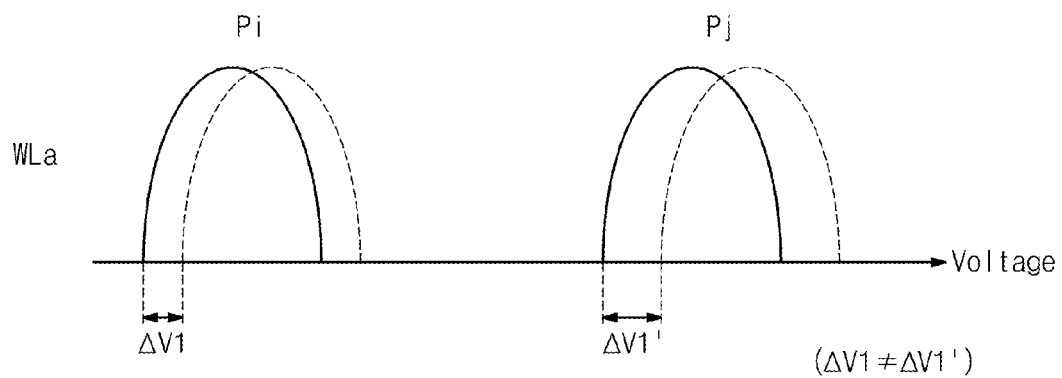

As illustrated in FIG. 2B, a temperature variation from nominal conditions may result in different threshold voltage variations from nominal for certain memory cells programmed to a state Pj as compared with other memory cells programmed to state Pi. Accordingly, the compensator circuit CPS of FIG. 1 will provide different compensating shifts for different groups of memory cells based on their respective programmed state. That is, a first compensating shift $\Delta V1$ is applied to a first threshold voltage distribution associated with a first data state Pi, and a second compensating shift $\Delta V1'$, different from the first compensating shift $\Delta V1$, is applied a second threshold voltage distribution associated with a second data state Pj.

Figure 2C:
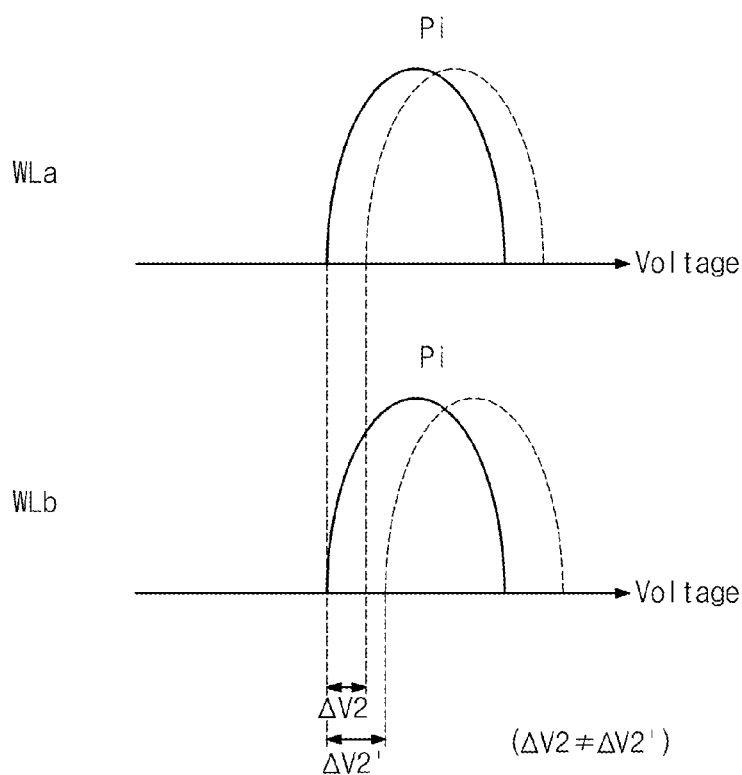

As illustrated in FIG. 2C, a temperature variation from nominal conditions may result in different threshold voltage variations from nominal for one group of memory cells associated with (i.e., coupled or connected to) a first word line WLa, as compared with another group of memory cells associated with a second word line WLb. Contemporary semiconductor memories generally include a great number of word lines extending over a large memory cell array. Voltage and temperature conditions for respective word lines will vary as a function of physical location within the memory cell array, and hence, threshold voltage distributions for associated memory cells will vary with the differing word line conditions. Accordingly, the compensator circuit CPS of FIG. 1 will provide different compensating shifts for different groups of memory cells based on the location of an associated word line. That is, for memory cells having a same programmed state Pi, for example, a first compensating shift $\Delta V2$ is applied to the threshold voltage distribution of a first group of memory cells associated with a first word line WLa, and a second compensating voltage $\Delta V2'$, different from the first compensating shift $\Delta V2$, is applied a second group of memory cells associated with a second word line WLb.

Figure 2D:
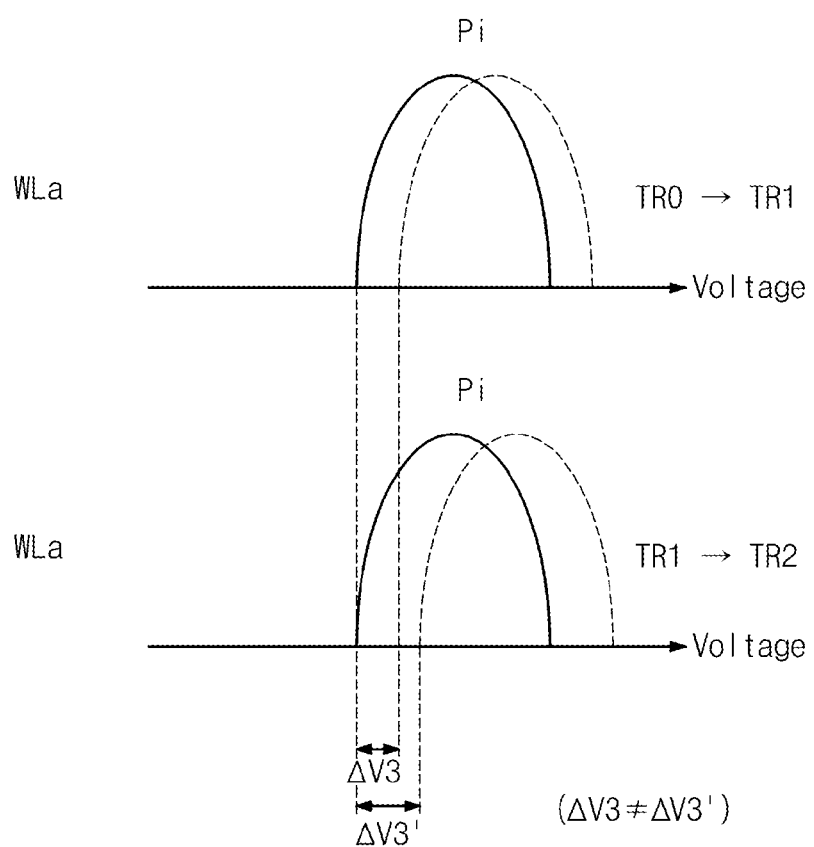

As illustrated in FIG. 2D, a temperature variation from nominal conditions may result in different threshold voltage variations from nominal for one group of memory cells having temperatures in a first range of temperatures, as compared with another group of memory cells having temperatures in a second range of temperatures. As previously noted, contemporary semiconductor memories include large memory cell arrays. Voltage and temperature conditions are not homogeneous across large memory cell arrays. Hence, a great multiplicity of actual temperature might exist affecting the threshold voltage distributions of constituent memory cells. To simplify temperature compensation, certain "temperature ranges" (TR) may be defined using (e.g.,) empirical data, and when a temperature detected in (e.g.) a certain region of the memory device falls within a defined temperature range TR, a corresponding compensating shift may be applied to the operating voltage.

Accordingly, the compensator circuit CPS of FIG. 1 will provide different compensating shifts for different groups of memory cells based on detected temperature range TR. That is, for a first group of memory cells having a detected (or calculated) temperature in a first temperature range TR1 above a nominal temperature range TR0, a first compensating shift $\Delta V3$ is applied, and for a second group of memory cells having a detected (or calculated) temperature in a second temperature range TR2 above the first temperature range TR1, a second compensating shift $\Delta V3'$, different from the first compensating shift $\Delta V3$, is applied.

The foregoing are merely selected examples of memory cell conditions that may be used to control the operation of the compensator circuit CPS according to embodiments of the inventive concept as a function of temperature. Those skilled in the art will recognize additional memory cell conditions (both fixed and variable) that might be identified, detected, and/or calculated in a manner that allows for the definition of an appropriate compensating shift in one or more operating voltages provided by one or more voltage generators VG within a non-volatile memory device.

Figure 3:
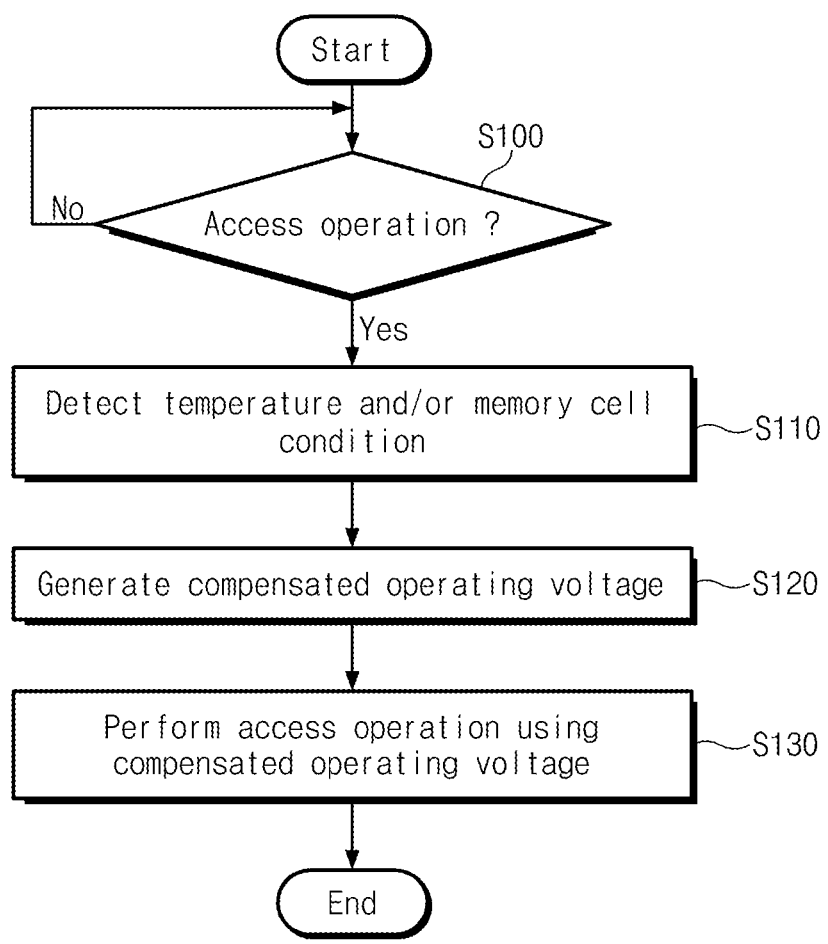
FIG. 3 is a flowchart summarizing operation of a non-volatile memory device according to an embodiment of the inventive concept.

FIG. 3 is a flowchart summarizing operation of a non-volatile memory device according to an embodiment of the inventive concept. Referring to FIGS. 1 and 3, a non-volatile memory device is operated in such a manner that a programmed state, as indicated by a corresponding threshold voltage distribution, is more accurately discriminated using a compensated operating voltage (i.e., an operating voltage that has been compensated as a function of one more memory cell conditions such as temperature). The programmed state of a selected memory cell (i.e., one or more memory cells indicated by an address) may be discriminated during different memory system operations (e.g., a read operation or a verification operation). Such memory system operations may be referred to generically as "access" operations and are distinguished from non-access operations that do not require discrimination of a threshold voltage distribution.

The method of FIG. 3, begins with receipt of a memory system command or instruction indicating an access operation should be performed (S100). The access operation command will typically include (or be provided in conjunction with) an address identifying one or more memory cells to be accessed ("the selected memory cell"). In response to the access operation command, the non-volatile memory device or a controller associated with the non-volatile memory device will detect (or calculate) a current temperature and/or memory cell condition (S110). For example, the compensator circuit CPS of FIG. 1 may be used to control the detection of the current temperature.

Alternately, a current temperature may be periodically detected without regard to the current memory system operation (e.g., access or non-access) or memory system state (e.g., idle or active), and stored in a defined register or memory location. Then, when an access operation command is received (S110), the previously stored current temperature value may be read from the register or memory location.

Using compensating data indicating a current temperature and/or other memory cell condition(s), the voltage generator circuit VG may be used to generate an operating voltage (e.g., a word line voltage) with a compensating shift, as necessary, to be applied to the selected memory cell (S120).

With generation and provision of the compensated operating voltage (S120), the non-volatile memory device is able to perform the requested access operation using an operating voltage that has been properly adjusted in view of the current temperature and/or relevant memory cell condition(s) (S130).

Within the foregoing method, some or all of the operating voltages generated by the voltage generator VG may have nominally defined (or default) values stored in a register or memory. Such values may be dynamically updated on a real time basis to reflect current memory system operating conditions using the method summarized in FIG. 3.

Figure 4:
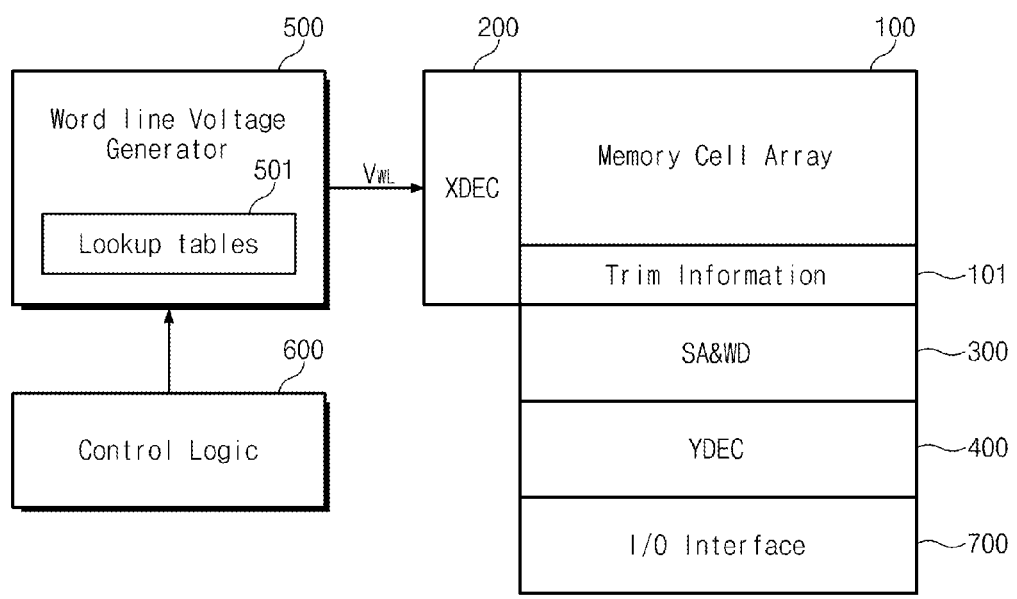
FIG. 4 is a block diagram further illustrating certain aspects of a flash memory device to which the voltage compensation described in FIG. 1 is applied.

FIG. 4 is a block diagram illustrating a flash memory device capable of executing the voltage compensating method described above in relation to FIGS. 1 and 3. A flash memory device is used in the description that follows as one example of a non-volatile memory devices that may be configured to incorporate the method, system and device embodiments of the inventive concept. Those skilled in the art will understand that the principles of the inventive concept, as taught by the illustrated embodiments, may be applied to other memory devices such as MRAM, PRAM, FRAM, and the like.

Referring to FIG. 4, a flash memory device according to an embodiment of the inventive concept comprises a memory cell array 100 including memory cells storing M-bit data, where M is a positive integer. The memory cells are arranged in rows along word lines and columns along bit lines. The memory cells may be configured to have a resistance or a threshold voltage that varies with programmed data state.

The memory cell array 100 may be used to store so-called "trim information" in a designated trim information region 101. Trim information may be used for various purposes, such as address repair, input/output (I/O) structure definition, voltage trimming, and the like. Here, certain voltage trim information may be used to compensate an operating voltage (hereafter, assumed to be a word line voltage for clarity of explanation) according to memory cell conditions such as current temperature, current temperature range, programmed data state, page information, word line location, etc. The voltage trim information may be stored in a register or memory disposed in the flash memory device, or disposed in an external device (e.g., a memory controller or host). Upon powering-up the non-volatile memory device, the voltage trim information may be used to configure one or more lookup tables controlling operation of the non-volatile memory device.

The flash memory device of FIG. 4 further comprises a row selector circuit (XDEC) 200, a sense amplifier and write driver (SA&WD) circuit 300, a column selector circuit (YDEC) 400, a word line voltage generator circuit 500, control logic 600, and an input/output (I/O) interface 700.

The row selector circuit 200 may be configured to select and drive rows of the memory cell array 100. Row selecting and driving of the row selector circuit 200 may be made under the control of the control logic 600. The sense amplifier and write driver circuit 300 may be configured to read data from the memory cell array 100 at a read operation and to write data therein at a program operation. The sense amplifier and write driver circuit 300 is called a page buffer circuit. The column selector circuit 400 may be configured to select data read by the sense amplifier and write driver circuit 300 by a predetermined unit (for example, a byte unit, a word unit, etc.). Data selected by the column selector circuit 400 may be transferred to an external device via the input/output interface 700. The circuits 300, 400, and 700 may operate under the control of the control logic 600.

Continuing to refer to FIG. 4, the word line voltage generator circuit 500 may be configure to generate one or more operating voltage(s) supplied to the selected memory cell (or a selected row/word line) of the memory cell array 100. The illustrated example of FIG. 4 shows a word line $V_{WL}$ being generated as one example of many different operating voltages (e.g., a well voltage, an erase voltage, etc.) that may be similarly generated while being compensated for memory cell conditions.

In the illustrated example of FIG. 4, the word line voltage generator circuit 500 comprises one or more lookup tables 501 that may be stored in one or more control information registers. The lookup tables 501 may be used to compensate the word line voltage in accordance with one or more memory cell condition(s). The control information values stored in the lookup tables 501 may be set upon memory device power-up, for example, by voltage trim information for the memory cell array 100 under the control of the control logic 600.

Consistent with certain embodiments of the inventive concept, it is possible to change the voltage trim information using the control logic 600 as the voltage trim information is loaded into the register storing the lookup tables 501 in view of current operating conditions (e.g., temperature) for the flash memory device. In this manner, the word line voltage generator circuit 500 may generate the word line voltage $V_{WL}$ based on actual memory cell conditions, such that access operations executed by the flash memory device accurately discriminate the threshold voltage distribution of selected memory cells.

Figure 5A:
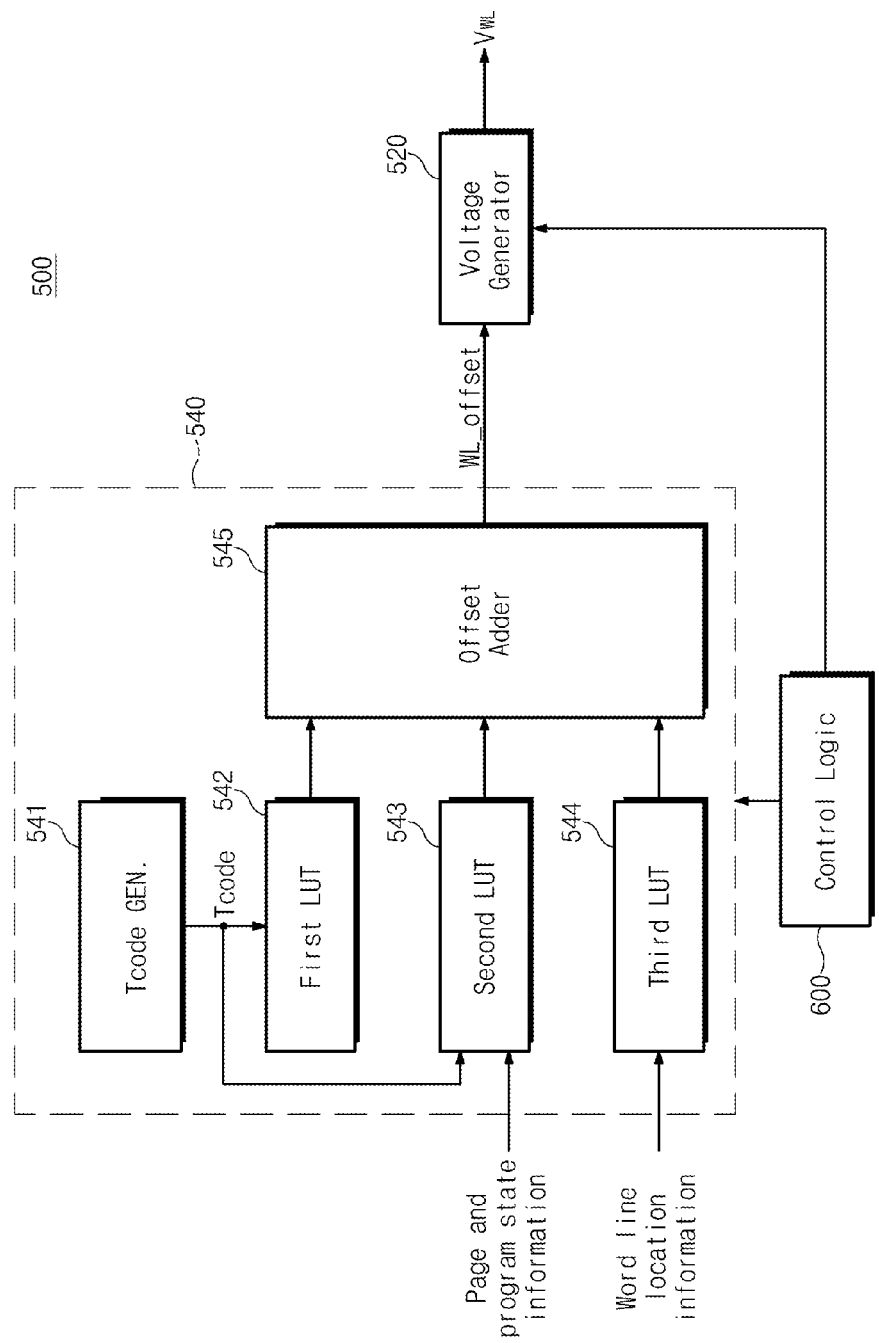
FIG. 5A is a block diagram further illustrating the word line voltage generator circuit of FIG. 4 according to an embodiment of the inventive concept.

FIG. 5A is a block diagram further illustrating the word line voltage generator circuit 500 of FIG. 4 according to an embodiment of the inventive concept.

Referring to FIG. 5, the word line voltage generator circuit 500 comprises a voltage generator 520 and a compensation circuit 540. The voltage generator 520 may be configured to generate an operating voltage (e.g., a word line voltage $V_{WL}$) according to a compensation offset value (e.g., a word line offset value WL_offset) obtained from the compensation circuit 540 under the control of the control logic 600.

In this manner, the compensation circuit 540 may control the voltage generator 520 to compensate the word line voltage $V_{WL}$ for variations in relevant memory cell conditions that depart from established nominal values or ranges. The word line voltage $V_{WL}$ generated by the voltage generator 520 may be a read voltage, a program voltage, a verification read voltage, and the like. The compensation circuit 540 of FIG. 5A comprises a temperature code generator 541 that generates a temperature code (Tcode) indicating a detected current temperature, along with first, second and third lookup tables 542, 543, and 544 storing offset values defined to correspond with certain memory cell conditions. The compensation circuit 540 also comprises an offset adder 545 that adds offset values respectively provided by the first, second and third lookup tables 542, 543, and 544. The word line voltage $V_{WL}$ is compensated by a cumulative word line offset value WL_offset provided by the offset adder 545.

The first lookup table 542 stores first offset values indicated a plurality of temperature ranges (TRs) over an allowable temperature range for the flash memory device. Respective temperature range offset values may vary up or down a nominal or default temperature range (e.g., vary downward from a highest temperature range, vary upward from a lowest temperature range, or vary upward and downward from an intermediate temperature range). One of the plurality of temperature range offset values stored in the first lookup table 542 will be selected by an applied Tcode from the Tcode generator 541 that corresponds to a detected current temperature.

The second lookup table 543 stores offset values correspondingly associated with programmed data states and/or page information. These particular memory cell conditions may be further indexed by a current Tcode. With this arrangement, a programmed state offset value, a page information offset value, or a programmed state may be provided to the offset adder 545, as a function of temperature range or merely as a function of programmed state and/or page information.

Thus, a program state offset value and/or a page information offset value may be provided additionally to (or as an alternative to) the temperature range offset. In this manner, the location of a selected memory cell within a particular page of a word line may be taken into account when determining an operating voltage compensation value. Offset values corresponding to respective programmed data states may be similarly taken into account. The example illustrated in FIG. 5A assumes that a program state offset value and/or a page information offset may be further adjusted by a temperature range corresponding to the detected current temperature, but this need not be the case and respective offsets may be independently determined.

The third lookup table 544 stores offset values that correspond to respective word line locations, or locations of defined groups of word lines in the memory cell array. For example, the third lookup table 544 may store word line location offset values that correspond to respective word lines (or word line groups) in a memory block.

In certain embodiments of the inventive concept, the first, second and third lookup tables 542, 543, and 544 of FIG. 5A will be implemented using the register 501 described in relation to FIG. 4, and the various offset values of the first, second and third lookup tables 542, 543, and 544 may be loaded from a trim information region 101 to the register 501 during power-up of the memory device. Offset values of the first, second and third lookup tables 542, 543, and 544 may be expressed as digital data values having any reasonable format and definition.

The offset adder 545 adds particular memory cell condition offset values (e.g., the temperature range offset value, the programmed state or page information offset value, and/or the word line location offset value) to generate a final "compensating offset value" that takes into account all relevant (or all selected) memory cell conditions. In this regard, those skilled in the art will recognize that the provision of the first, second and third lookup tables 542, 543, and 544 in the working example is just one selected example of many different embodiments of the inventive concept. However many memory cell conditions are selected for consideration by a non-volatile memory device (and the corresponding number of offset values), the compensating offset value provided by the compensation circuit 540 will be the cumulative expression of these memory cell conditions. It is possible that variation in one memory cell condition will increase the level of the operating voltage being compensated while variation in another memory cell condition will decrease the level. The number and type of memory cell condition(s) considered by the compensation circuit 540 under the control of the control logic 60 is matter of design choice, and may vary with application, power conditions, and memory system operating speed.

In the example of FIG. 5A, the compensating word line offset value WL_offset is provided to the voltage generator 520 and is used to compensate the word line voltage being generated in view of expected threshold voltage distribution shifts for selected memory cells operating under a given set of memory cell conditions (e.g., temperature range, programmed data state, page location and word line location). Off further note, the control logic 600 may be used to selectively control the number and nature of lookup table entries contributing to the final compensation offset value. Alternatively, the offset adder 545 is omitted, and respective offset values from the first, second and third lookup tables 542, 543, and 544 may be directly applied to the voltage generator 520.

Hence, the voltage generator 520 in its operation may compensate the word line voltage $V_{WL}$ sequentially or simultaneously in response to one or more offset values received from the first, second and third lookup tables 542, 543, and 544. Compensation of the word line voltage $V_{WL}$, for example, may be made by varying a resistance value of a resistor string within the voltage generator 520 using voltage division controlled by the offset values of the first, second and third lookup tables 542, 543, and 544 or by the compensating offset value WL_offset. Although not illustrated in figures, the voltage generator 520 may include one or more charge pump(s) used to generate a relatively high operating voltage, a regulator that regulates the high operating voltage in relation to a reference voltage, etc.

Alternatively, the voltage generator 520 may include a regulator. In this case, the voltage generator 520 may output a fixed word line voltage $V_{WL}$ using a high voltage received from a charge pump and thereafter adjust the word line voltage in accordance with the compensating word line offset value WL_offset and the current mode of operation for the non-volatile memory device.

Figure 5B:
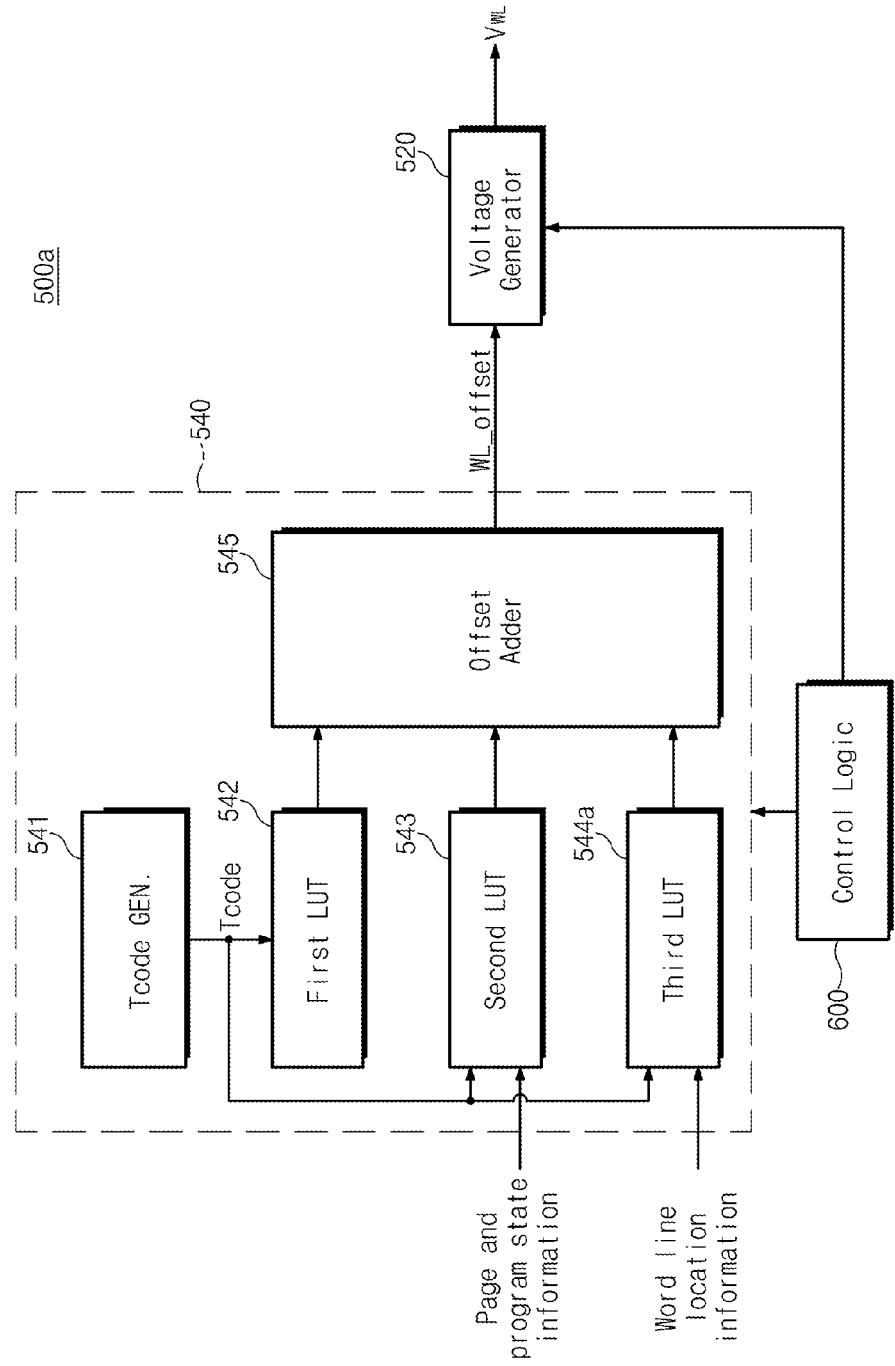
FIG. 5B is a block diagram further illustrating the word line voltage generator circuit of FIG. 4 according to another embodiment of the inventive concept.

FIG. 5B is a block diagram further illustrating the word line voltage generator circuit of FIG. 4 according to another embodiment of the inventive concept.

The embodiment of FIG. 5B is similar to the embodiment of FIG. 5A, except the Tcode provided by the temperature code generator 541 is used to modify not only the programmed data state offset value and/or page location offset value, but also the word line location offset value. Thus, the particular embodiment of FIG. 5B further emphasizes that each memory cell condition considered by a particular non-volatile memory device may be independently applied to the compensation of an operating voltage, or an offset value associated with the memory cell condition may be indexed or modified by another memory cell condition. In the embodiment of FIG. 5B, it is assumed that current temperature range influences the determination of all other offset values associated with other memory cell conditions. Thus, an actual word line location offset is potentially modified by the Tcode provided by the temperature code generator 541 in relation to a current temperature.

In the foregoing context, temperature range may be said to be a dominant memory cell condition while word line location, page information, and/or programmed state data may be said to be subordinated memory cell conditions because their relative influence on the ultimate compensation of an operating voltage is influenced (further adjusted) by one or more dominant memory cell conditions.

Figure 6:
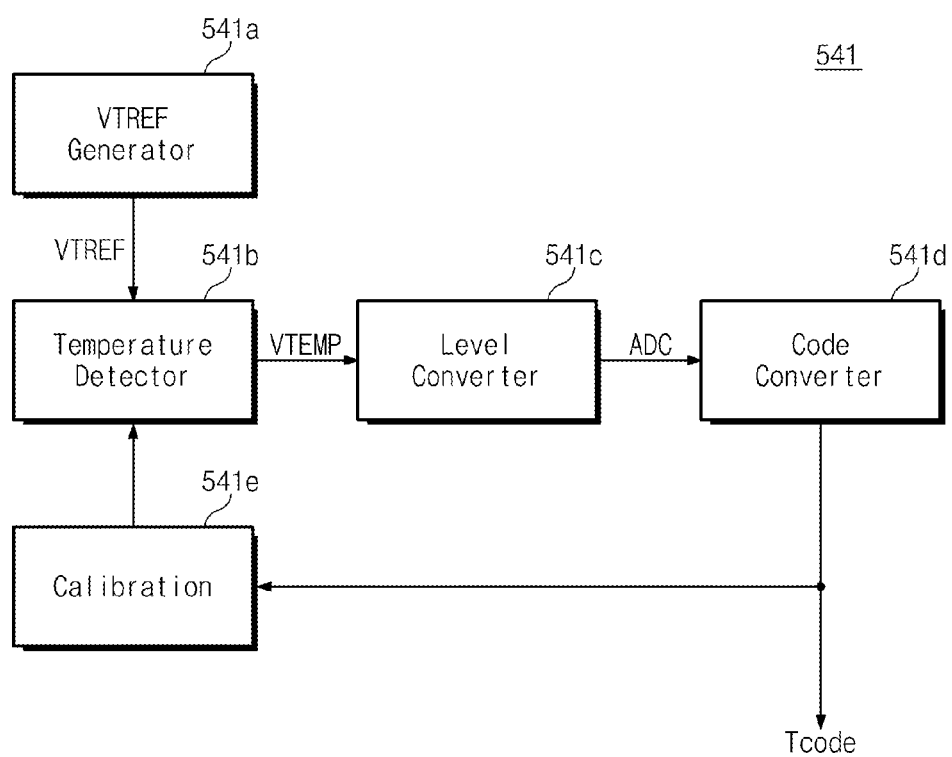
FIG. 6 is a block diagram further illustrating the temperature code generating part of FIG. 5.

FIG. 6 is a block diagram further illustrating one possible example of the temperature code generator 541 of FIGS. 5A and 5B.

Referring to FIG. 6, the temperature code generator 541 comprises a reference voltage generator 541a that generates a stable (i.e., fixed) reference voltage VTREF regardless of memory cell conditions; a temperature detector 541b that generates an analog temperature voltage VTEMP corresponding to a detected current temperature in response to the reference voltage VTREF; a level converter 541c that converts the analog temperature voltage VTEMP into a corresponding digital code ADC; and a temperature code converter 541d that converts the digital code ADC into a corresponding temperature code Tcode. Here, the temperature code converter 541d may be used to reduce the number of bits that express the digital code ADC down to a fewer number of bits that express the temperature code Tcode.

The temperature code generator 541 may further comprise a calibration part 541e that determines whether the temperature code Tcode is set to a value corresponding to the default temperature, and thereby controls the temperature detector 541b according to the determination result. The analog temperature voltage VTEMP provided by the temperature detector 541b will vary under the control of the calibration part 541e. For example, the calibration part 541e may be used to reset the analog temperature voltage VTEMP to its default setting as defined in relation to the default temperature. The calibration part 541e may only be activated during a test operation and/or a power-up initialization operation and be inactivated during normal operation.

Figure 7A:
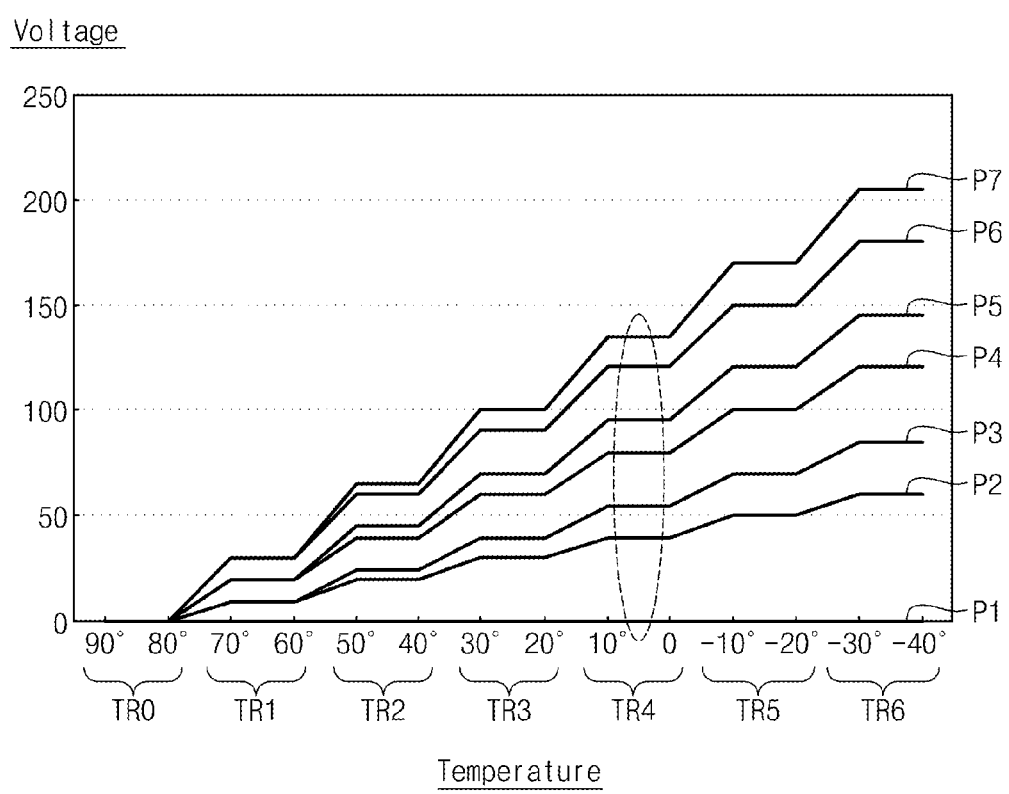
FIGS. 7A and 7B are graphs illustrating exemplary offset values included in the second lookup table of FIGS. 5A and 5B.
Figure 7B:
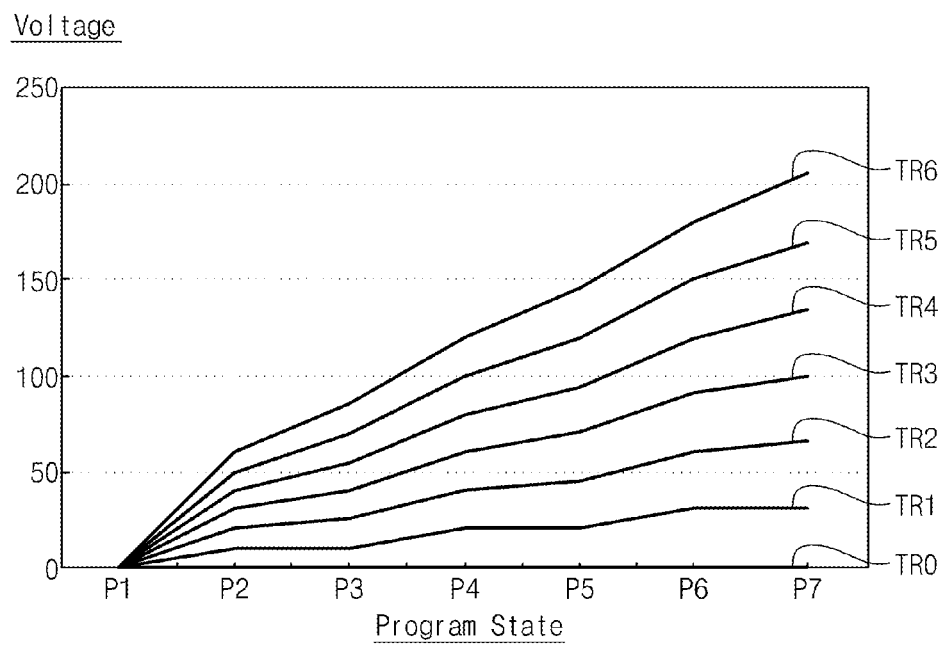

FIGS. 7A and 7B are graphical diagrams further describing offset values that may be included in one or more of the lookup tables described in FIGS. 5A and 5B. It is assumed for purposes of explanation that a flash memory device operates within a permissible temperature range of +90° C. to −40° C. It is further assumed that the default temperature for the memory device is its highest temperature (90° C.). With these assumptions, the threshold voltage distribution for a memory cell would increase (broaden) as the actual temperature of the memory device fall from the default temperature. Accordingly, the operating voltage (e.g., a word line voltage) applied to the memory cell should be compensated to account for any permissible temperature variation below the default temperature. Alternately, if the default temperature was defined as the lowest temperature (−40° C.) of an allowable temperature range, the threshold voltage of a memory cell would decrease (narrow) as the actual temperature of the memory device rose from the default temperature. As a result, the operating voltage applied to a memory cell should be compensated to take into account for any permissible temperature above the default temperature.

Referring to FIG. 7A, the graph further describes variation of a compensating offset value as function of programmed data states (e.g., seven programmed states P1 to p7 for an assumed 3-bit MLC) over a permissible operating temperature range divided into seven (7), uniform temperature ranges TR0 to TR6. Respective offset values for a particular temperature range (e.g., the dotted line shown in temperature range TR4 in FIG. 7A) may be determined in relation to the particular program state of the selected memory cell, since the threshold voltage distribution of the selected memory cell will vary with not only temperature range, but also programmed data state as described in FIG. 2B. Hence, as may be understood from FIG. 7A, a defined offset value for each programmed data state P1-P7 (a subordinated memory cell condition) may be adjusted in accordance with a determined temperature range (a dominant memory cell condition). In this manner, the variably increasing/decreasing slopes of the offset values for the programmed data states may be appropriately determined in view of the current temperature of the memory device. Here, the increasing/decreasing slope indicates a difference of offset values, each corresponding to a different temperature range for any programmed data state. Such increasing/decreasing slopes for offset values associated with one memory cell condition (e.g., programmed data states P1 to P7) for respective temperature ranges may be determined continuous or stepped.

The graph of FIG. 7B inverts the illustrated relationship between offset values associate with programmed data states P1 to P7 and different temperature ranges TR1-TR6 as compared with the graph of FIG. 7A. In so doing, the different approach to the definition of the increasing/decreasing slopes of the offset values is illustrated. By using offset values associated with a subordinated memory cell condition (e.g., programmed data state) that are continuously determined, the threshold voltage distribution of memory cells may be exactly shift-compensated in view of a current temperature.

In certain embodiments of the inventive concept, increasing/decreasing slopes of offset values may be modified by the control logic 600 when voltage trim information is loaded to the register storing the lookup tables 501 from a memory cell array 100. Alternatively, multiple voltage trim information sets reflecting various increasing/decreasing slopes of offset values may be stored in the memory cell array 100, wherein any one of the multiple voltage trim information sets may be selected by the control logic 600 upon memory device power-up and then loaded to the lookup table register 501. Selection of a voltage trim information set or change in voltage trim information may be made under the instruction of an external device (e.g., a memory controller or host).

Figure 8:
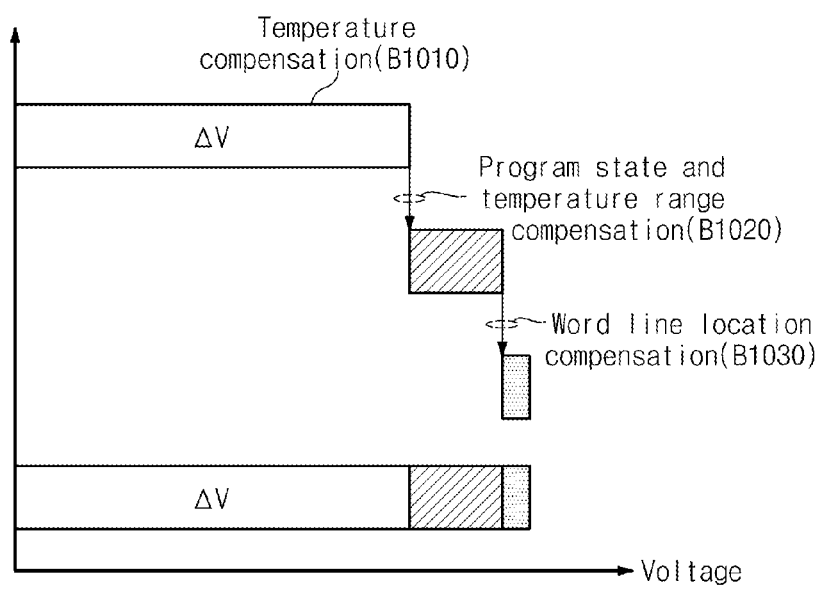
FIG. 8 is a conceptual diagram describing one possible voltage compensation method applied to a flash memory device according to an embodiment of the inventive concept.

FIG. 8 is a conceptual diagram further describing a voltage compensation method applied to a flash memory device according to an embodiment of the inventive concept.

Here again, it is assumed that the flash memory device operates over a permissible temperature range of 90° C. to −40° C. Further, it is assumed that the default temperature is the highest permissible temperature (90° C.). It is assumed that a temperature range is divided into a plurality of temperature ranges (for example, TR0 to TR6). A temperature range including the default temperature is referred to as a default temperature range (e.g., TR0). With these assumptions, the threshold voltage distribution of a memory cell will increase (broaden) as the temperature of the memory device falls from the default temperature range. Accordingly, an operating voltage (e.g., a word line voltage) applied to the memory cell should be compensated taking into account this temperature variation.

A voltage compensation method according to an embodiment of the inventive concept may begin by compensating the word line voltage in proportion to the temperature variation (B1010). For example, when the current temperature falls within a particular temperature range, as detected by the compensation circuit 540, different from the default temperature region, the word line voltage will be compensated by a predetermined magnitude ΔV that is proportional to the magnitude of the temperature variation. Compensation of the word line voltage in proportion to the temperature variation may be made using an offset value provided from the first lookup table 542 in response to a temperature code Tcode.

The voltage compensation method of FIG. 8 further compensates the word line voltage based on the programmed data state of the memory cell in view of the current temperature range (B1020). This further compensation may be made using an offset value provided from the second lookup table 543 as indexed by the temperature code Tcode.

The voltage compensation method of FIG. 8 still further compensates the word line voltage based on the physical location of selected word line (B1030). This further compensation may be made using an offset value provided from the third lookup table 544.

As may be understood from FIG. 8, the word line voltage, as one specific example of a class of operating voltage that may be similarly compensated using embodiments of the inventive concept, is compensated not only in proportion to a temperature variation, but also in view of the programmed data state of the selected memory cell as indexed by the current temperature range, and the location of the selected word line. As a result, the threshold voltage distribution of the selected memory cell—that has been shifted from a nominal range by the combination of the foregoing memory cell conditions—may be properly discriminated by an optimized word line voltage. Read errors are thereby reduced, and the reliability of the memory system may be improved over a range of operating conditions.

With regard to the example of FIG. 8, operating voltage compensation in view of different memory cell conditions (e.g., application of digital offset values controlling the voltage generator VG) may be made either sequentially or simultaneously. Dominant (independently determined and applied) memory cell conditions and/or subordinated (dependently indexed or referenced and then applied) memory cell conditions may be used during compensation. The operating voltage(s) thus compensated may be applied to a variety of memory cell array structures including both two-dimensional and three-dimensional array structures.

Figure 9:
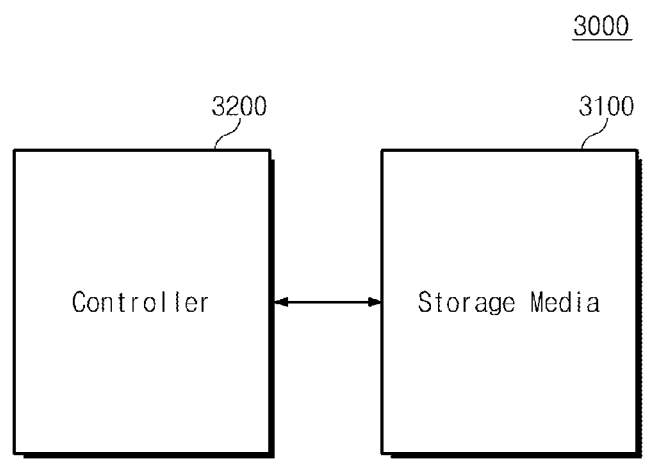
FIG. 9 is a general block diagram illustrating a data storage device including a non-volatile memory device according to an embodiment of the inventive concept.

FIG. 9 is a block diagram illustrating a data storage device including a non-volatile memory device according to an embodiment of the inventive concept.

Referring to FIG. 9, a data storage device 3000 generally comprises a storage media 3100 and a controller 3200. The storage media 3100 may be used to store data information having various data types such as text, graphic, software code, etc. The storage media 3100 may be formed of a non-volatile memory device described in FIG. 1 or 4, and may be configured to compensate a word line voltage according to the above-described voltage compensating manner. The controller 3200 may be configured to control the storage media 3100 in response to an external request.

Figure 10:
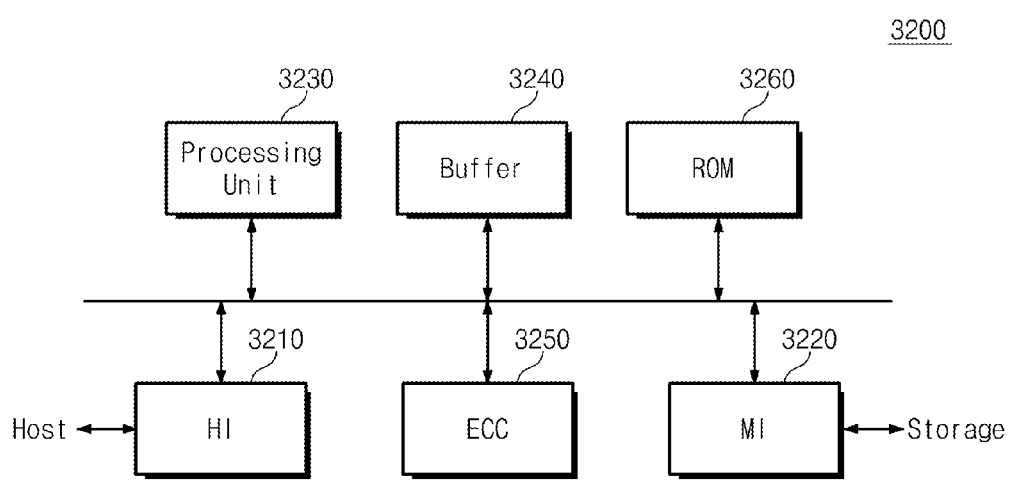
FIG. 10 is a block diagram further illustrating the controller of FIG. 9 according to an embodiment of the inventive concept.

FIG. 10 is a block diagram further illustrating the controller of FIG. 9 according to an embodiment of the inventive concept. Referring to FIG. 10, the controller 3200 comprises a first interface (HI) 3210, a second interface (MLI) 3220, a processing unit 3230, a buffer 3240, an error detection and/or correction (ECC) unit 3250, and a Read Only Memory (ROM) 3260.

The first interface 3210 may be configured to interface with an external device (e.g., a host). The second interface 3220 may be configured to interface with the storage media 3100 of FIG. 9. The processing unit 3230 may be a Central Processing Unit (CPU) configured to operate firmware such as a Flash Translation Layer (FTL) controlling in part the operation of the storage media 3100. The buffer 3240 may be used to temporarily store data received from, or to be sent to the external device via the first interface 3210. The buffer 3240 may also be used to temporarily store data received from, or to be sent to the storage media 3100 via the second interface 3220. The ECC unit 3250 may be configured to encode data to be stored in the storage media 3100 and to decode read data retrieved from the storage media 3100.

Figure 11:
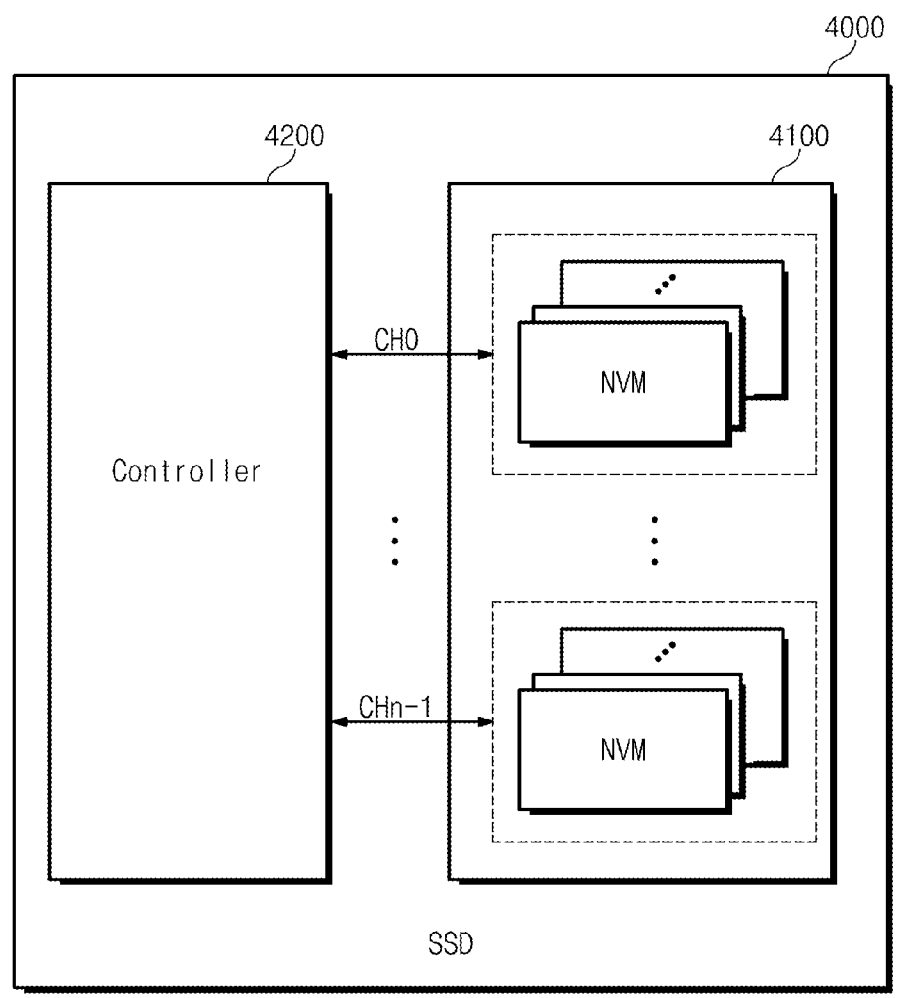
FIG. 11 is a block diagram illustrating a solid state drive (SSD) that incorporates a non-volatile memory device according to an embodiment of the inventive concept.

FIG. 11 is a block diagram illustrating a solid state drive (SSD) that may incorporate a non-volatile memory device according to embodiment of the inventive concept.

Referring to FIG. 11, a SSD 4000 generally comprises storage media 4100 and a controller 4200. The storage media 4100 is connected to the controller 4200 via a plurality of channels, each of which is commonly connected with a plurality of non-volatile memories forming the storage media. Each non-volatile memory device may be formed of a memory described in FIG. 1 or 4. The controller 4200 may be conventionally configured according to one or more known protocols to control the storage media 4100.

Figure 12:
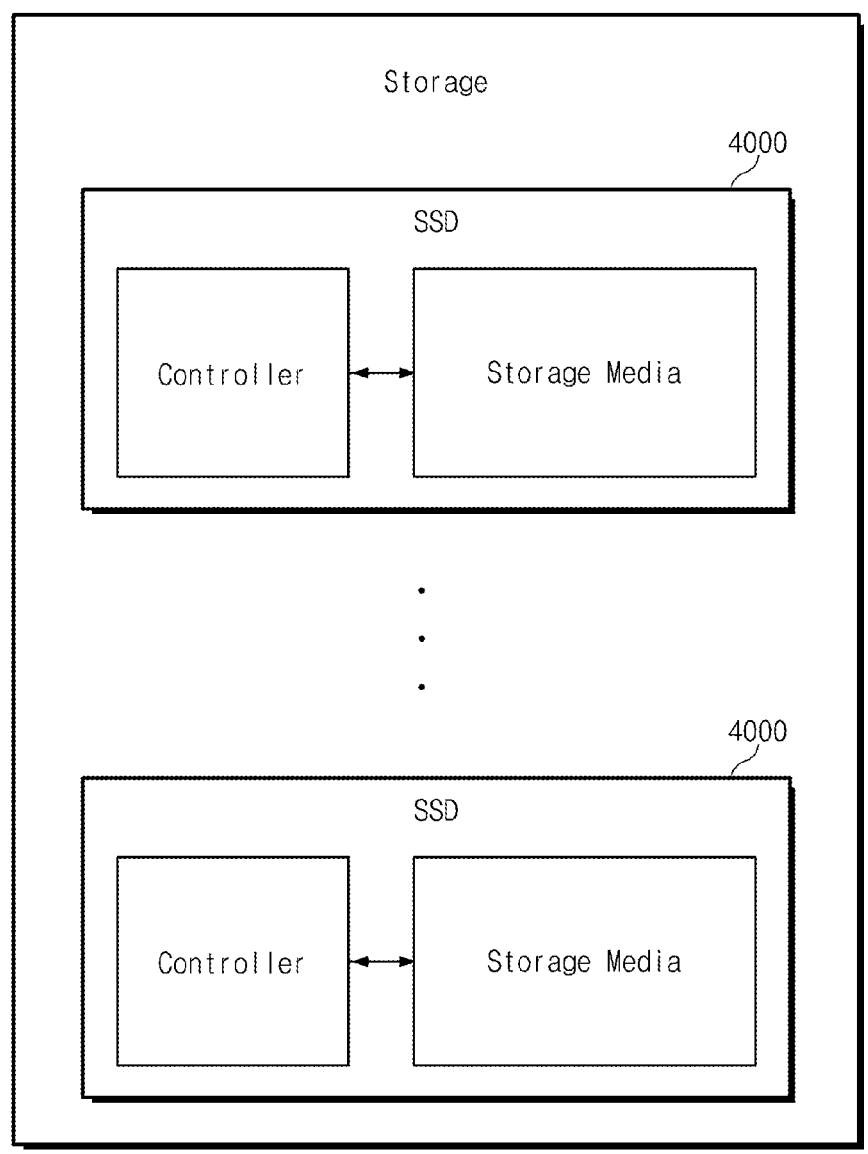
FIG. 12 is a block diagram further illustrating the SSD of FIG. 11.
Figure 13:
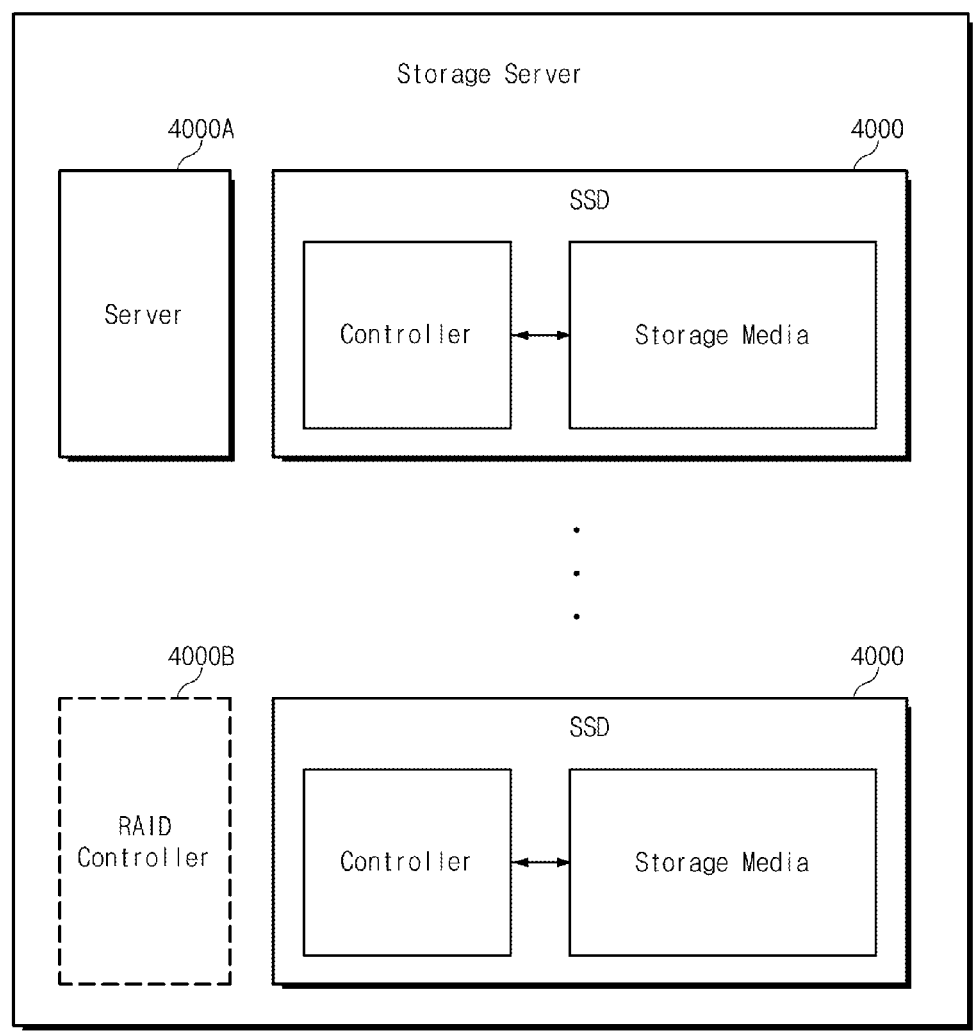
FIG. 13 is a block diagram illustrating a storage server incorporating the SSD of FIG. 11.

FIG. 12 is a block diagram further illustrating the storage media 4100 of the SSD of FIG. 11. FIG. 13 is a system block diagram illustrating a storage server incorporating the SSD of FIG. 11.

An SSD 4000 according to an embodiment of the inventive concept may be used to form a non-volatile memory device forming the storage media of FIGS. 11, 12 and 13. As illustrated in FIG. 12, the storage media includes a plurality of SSDs 4000 similarly configured as described in FIG. 11. The SSD 4000 according to an embodiment of the inventive concept is used to configure a storage sever. As illustrated in FIG. 13, a storage server may include a plurality of SSDs 4000 configured as described in FIG. 11, and a server 4000A. Further, a conventionally understood RAID controller 4000B may additionally be provided in conjunction with the storage server.

Figure 14:
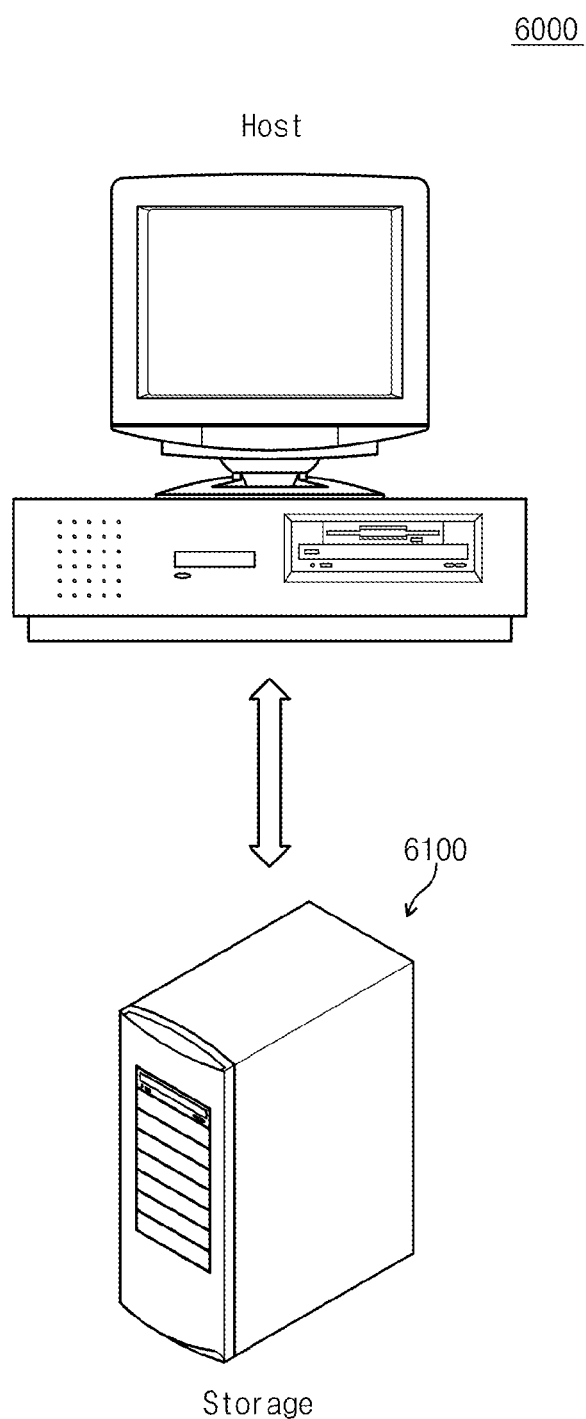
FIGS. 14 to 16 are diagrams illustrating various systems that may incorporate a data storage device according to an embodiment of the inventive concept.
Figure 15:
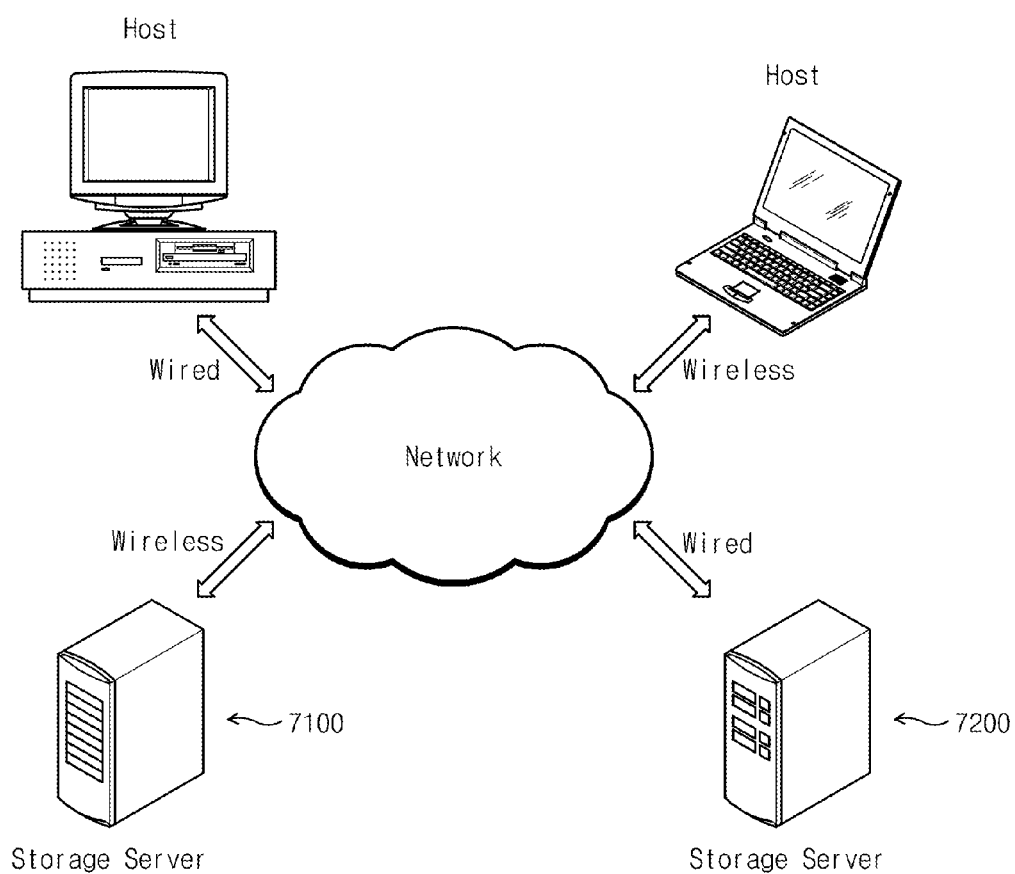
Figure 16:
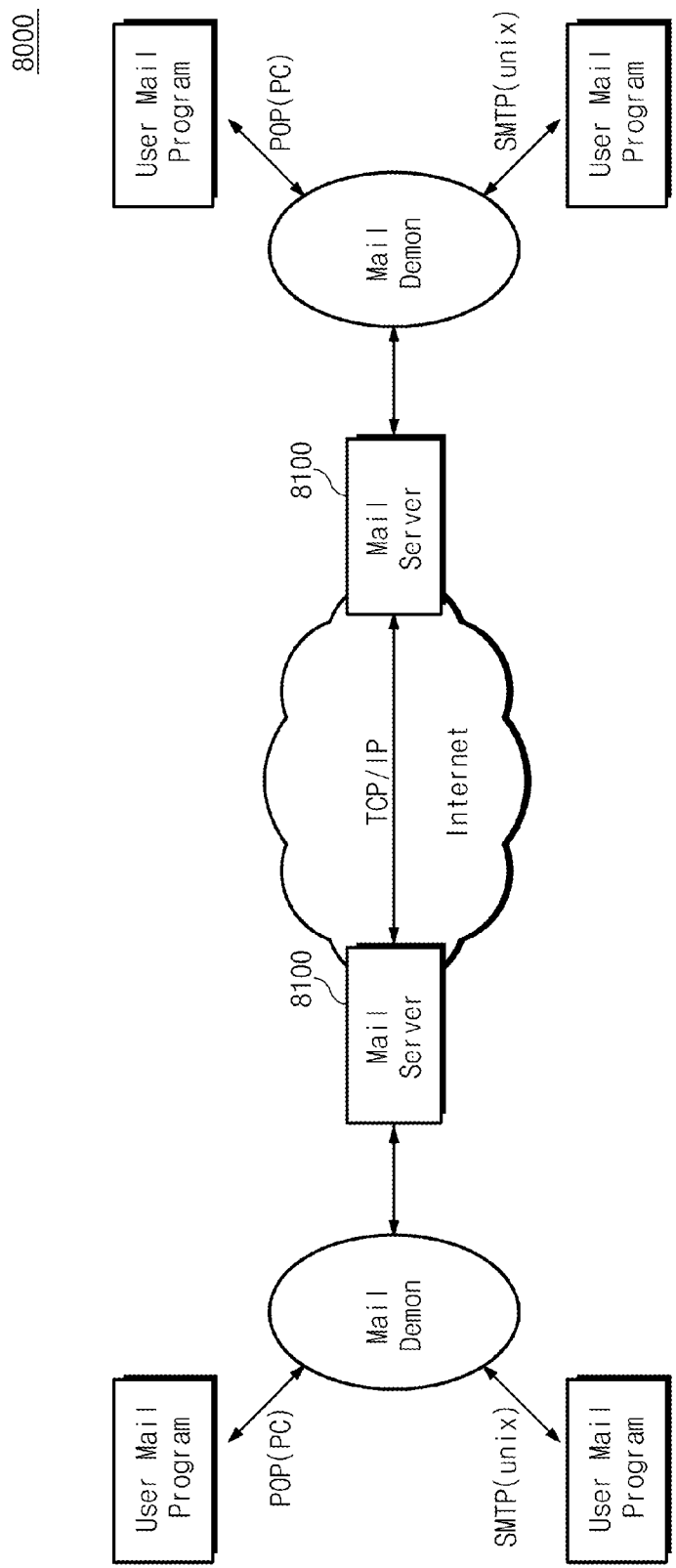

FIGS. 14, 15 and 16 are diagrams illustrating various systems that may incorporate a data storage device using a non-volatile memory device according to embodiment of the inventive concept.

In the event that a SSD including a data storage device according to an embodiment of the inventive concept is applied to the storage media, as illustrated in FIG. 14, a system 6000 may include storage media 6100 configured to communicate with a host via a hard wire or wireless connection. In a case where a SSD including a data storage device according to an embodiment of the inventive concept is applied to a storage server, as illustrated in FIG. 15, a system 7000 may include a storage servers 7100 and 7200 configured to communicate with a host via a hard wire or wireless connection. Further, as illustrated in FIG. 16, a SSD including a data storage device according to an embodiment of the inventive concept may be applied to a mail server 8100 operating within a distributed network system 8000.

FIGS. 17 through 21 are diagrams illustrating other systems that may incorporate a data storage device according to an embodiment of the inventive concept.

Figure 17:
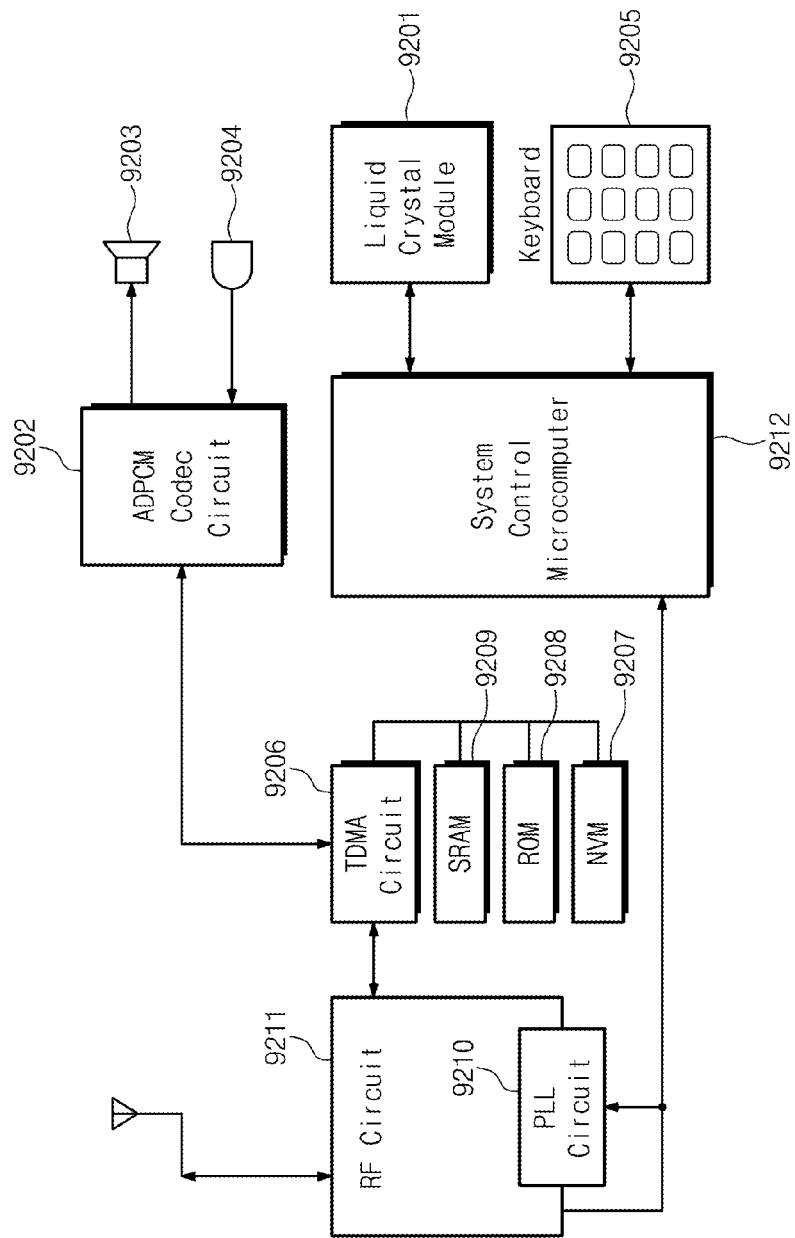
FIGS. 17 to 21 are diagrams illustrating additional systems that may incorporate a data storage device according to an embodiment of the inventive concept.

FIG. 17 is a block diagram illustrating a cellular phone system according to an embodiment of the inventive concept.

Referring to FIG. 22, the cellular phone system comprises an ADPCM codec circuit 9202 for compressing a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system may include various types of memories, such as the non-volatile memory device 9207, the ROM 9208, and the SRAM 9209. The non-volatile memory device 9207 may be formed of a non-volatile memory device according to embodiments of the inventive concept. The ROM 9208 may be used to store programs, and the SRAM 9209 may be used as a work region for the system control microcomputer 9212 or/and to temporarily store data. Herein, the system control microcomputer 9212 is a processor which is configured to control write and read operations of the non-volatile memory device 9207.

Figure 18:
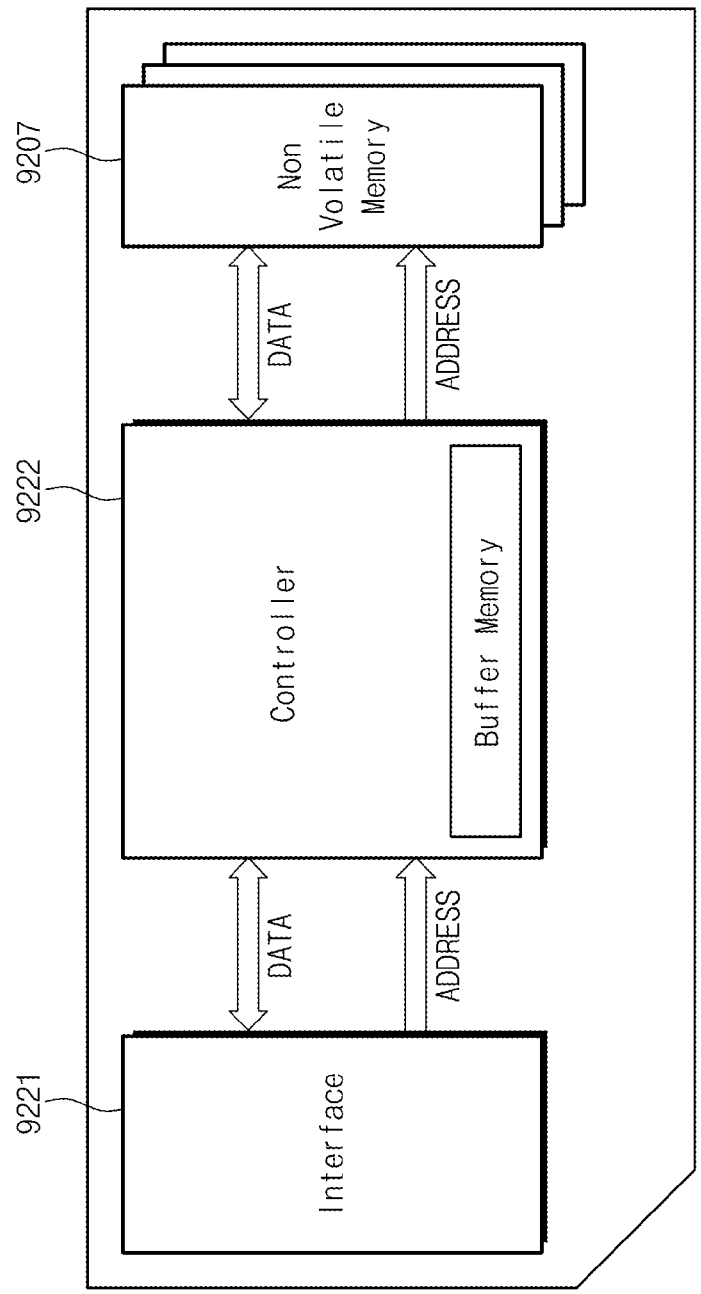

FIG. 18 is a block diagram illustrating a memory card according to an embodiment of the inventive concept. The memory card may be (e.g.) a MMC card, a SD card, a multiuse card, a micro-SD card, a memory stick, a compact SD card, an ID card, a PCMCIA card, a SSD card, a chip-card, a smartcard, an USB card, or the like.

Referring to FIG. 18, the memory card comprises an interface circuit 9221 that interfaces with an external device, a controller 9222 including a buffer memory and controlling an operation of the memory card, and at least one non-volatile memory device 9207 according to embodiments of the inventive concept. The controller 9222 may be a processor which is configured to control write and read operations of the non-volatile memory device 9207. In particular, the controller 9222 may be coupled with the non-volatile memory device 9207 and the interface circuit 2221 via a data bus and an address bus.

Figure 19:
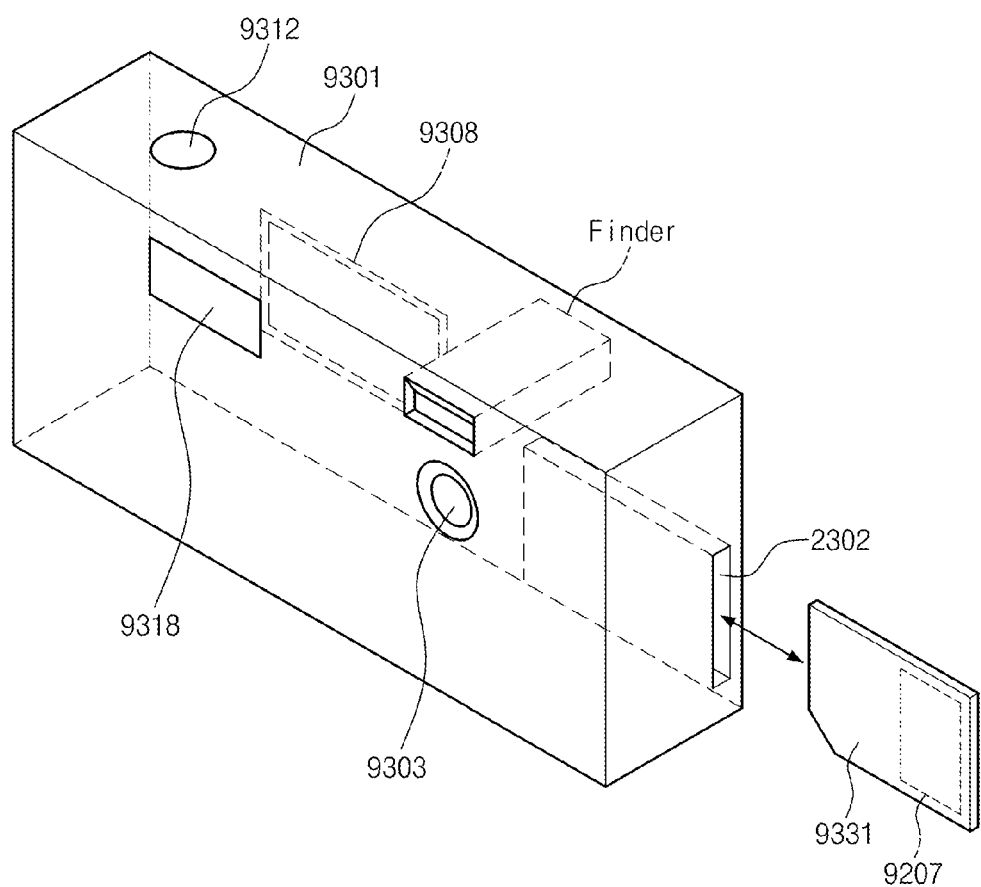

FIG. 19 is a block diagram illustrating a digital camera according to an embodiment of the inventive concept.

Referring to FIG. 19, the digital still camera comprises a body 9301, a slot 9302, a lens 9303, a display circuit 9308, a shutter button 9312, a strobe 9318, and the like. In particular, a memory card 9331 may be inserted in the slot 9308 and include at least one non-volatile memory device 9207 according to embodiments of the inventive concept.

If the memory card 9331 has a contact type, an electric circuit on a circuit board may be electrically contacted with the memory card 9331 when it is inserted in the slot 9308. In the event that the memory card 9331 has a non-contact type, an electric circuit on a circuit board may communicate with the memory card 9331 in a radio-frequency manner.

Figure 20:
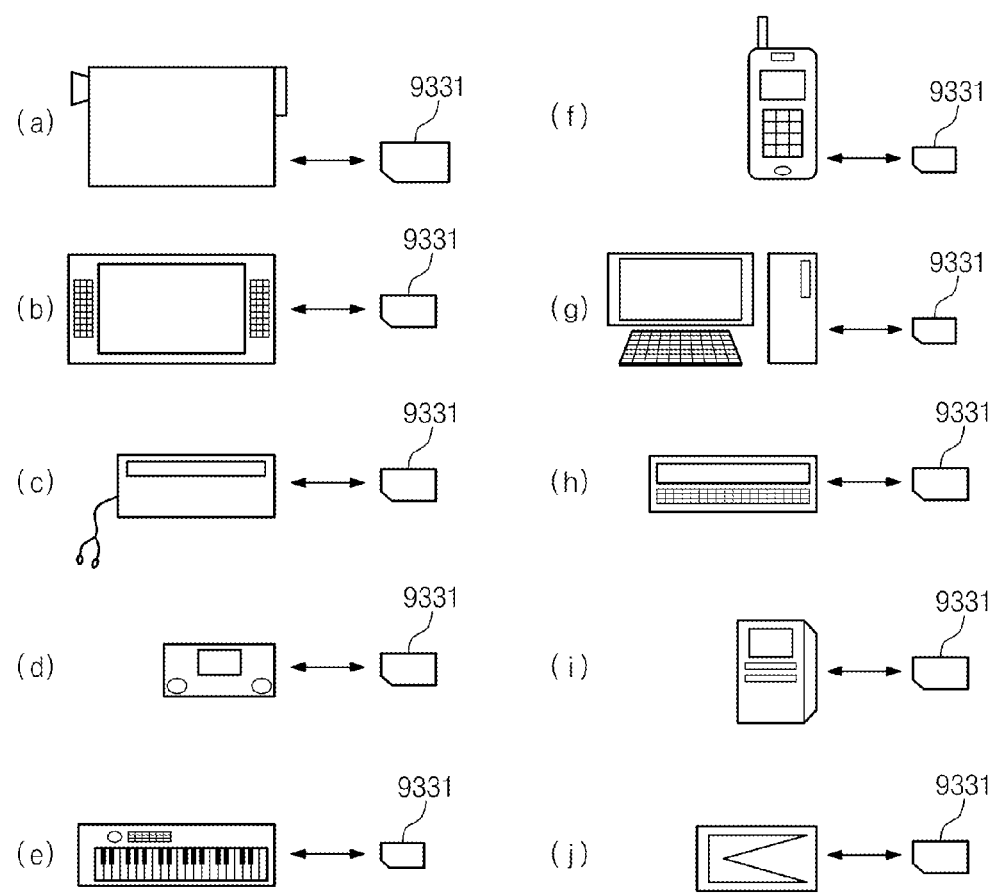

FIG. 20, inclusive of FIGS. 20(*a*) through 20(*j*), is a collection diagram variously illustrating systems to may incorporate a memory card such as the type described with reference to FIG. 19.

Referring to FIG. 20, a memory card 9331 may be applied to (a) a video camera, (b) a television, (c) an audio device, (d) a game machine, (e) an electronic music device, (f) a cellular phone, (g) a computer, (h) a Personal Digital Assistant (PDA), (i) a voice recorder, (j) a PC card, and the like.

Figure 21:
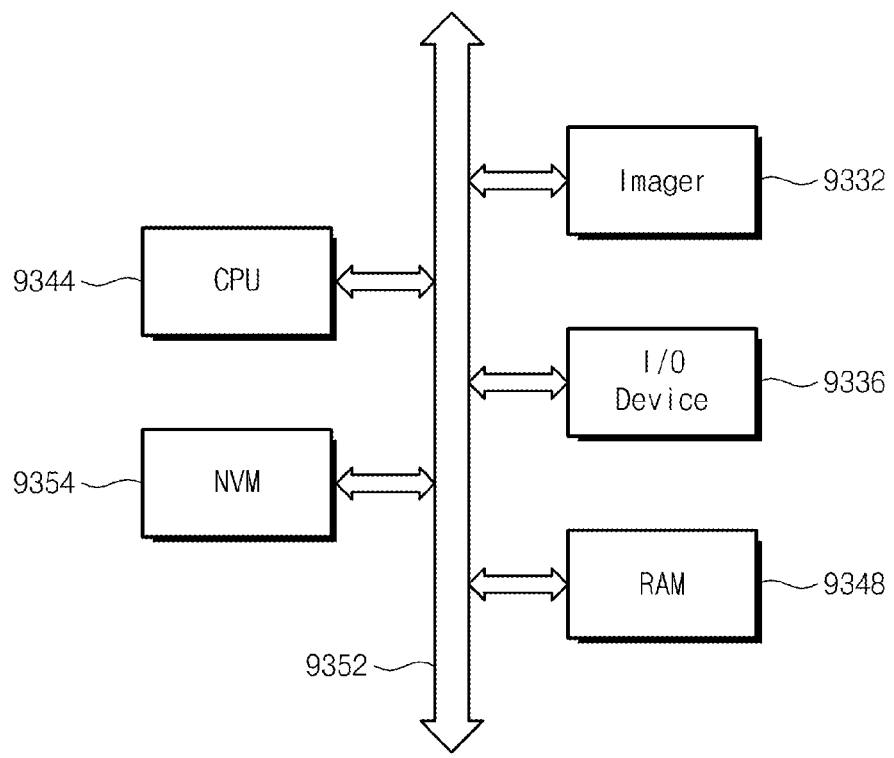

FIG. 21 is a block diagram illustrating an image sensor system according to an exemplary embodiment of the inventive concept.

Referring to FIG. 21, the image sensor system comprises an image sensor 9332, an input/output device 9336, RAM 9348, CPU 9344, and a non-volatile memory device 9354 according to embodiments of the inventive concept. The different system components of FIG. 21 may communicate via a bus 9352. The image sensor 9332 may include a photo sensing device such as a photo-gate, photo-diode, or the like. The system components of FIG. 21 may be formed on a single chip together with a processor or independently from the processor.

The above-disclosed subject matter is to be considered illustrative, and not restrictive, and the appended claims are intended to cover all such modifications, enhancements, and other embodiments that fall within their scope. Thus, to the maximum extent allowed by law, the scope is to be determined by the broadest permissible interpretation of the following claims and their equivalents, and shall not be restricted or limited by the foregoing detailed description.

What is claimed is:

1. A method generating an operating voltage in a non-volatile memory device including a memory cell array of non-volatile memory cells, the method comprising:
   detecting at least one memory cell condition including a current temperature for the non-volatile memory device;
   generating the operating voltage to be applied to a selected memory cell in the memory cell array; and
   compensating the operating voltage in response to the at least one memory cell condition,
   wherein the at least one memory cell condition includes in addition to the current temperature at least one of a programmed data state of the selected memory cell, a location of the selected memory cell in the memory cell array, page information associated with the selected memory cell, and a location of a selected word line associated with the selected memory cell in the memory cell array.

2. The method of claim 1, wherein the at least one memory cell condition comprises a plurality of temperature ranges extending over a permissible temperature operating range for the non-volatile memory device, and
   compensating the operating voltage comprises:
      respectively assigning a different one of a plurality of compensating shifts to each one of the plurality of temperature ranges;
      determining a current temperature range among the plurality of temperature ranges that includes the current temperature; and
      applying one of the plurality of compensating shifts to the operating voltage that corresponds to the current temperature range.

3. The method of claim 2, wherein the operating voltage is one of a read voltage used to discriminate a threshold voltage distribution for the selected memory cell during a read operation performed by the non-volatile memory device, and a read verification voltage used to discriminate a threshold voltage distribution for the selected memory cell during a program operation performed by the non-volatile memory device.

4. The method of claim 1, wherein the selected memory cell is configured to be programmed according to a first program state and a second program state,
   the at least one memory cell condition comprises a temperature range including the current temperature and the programmed state of the selected memory cell, and
   compensating the operating voltage comprises:
      applying a first compensating shift to the operating voltage when the selected memory cell is programmed to the first programmed state; and
      applying a second compensating shift different from the first compensating shift to the operating voltage when the selected memory cell is programmed to the second programmed state.

5. The method of claim 4, wherein the operating voltage is one of a read voltage used to discriminate a threshold voltage distribution for the selected memory cell during a read operation performed by the non-volatile memory device, and a read verification voltage used to discriminate a threshold voltage distribution for the selected memory cell during a program operation performed by the non-volatile memory device.

6. The method of claim 1, wherein the selected memory cell is one of a first memory cell associated with a first word line of the memory cell array and a second memory cell associated with a second word line of the memory cell array,
   the at least one memory cell condition comprises the location of the selected word line in the memory cell array, and
   compensating the operating voltage comprises:
      if the selected memory cell is the first memory cell, applying a first compensating shift to the operating voltage corresponding to a location of the first word line in the memory cell array; and
      if the selected memory cell is the second memory cell, applying a second compensating shift different from the first compensating shift to the operating voltage corresponding to a location of the second word line in the memory cell array.

7. The method of claim 6, wherein the operating voltage is one of a read voltage used to discriminate a threshold voltage distribution for the selected memory cell during a read operation performed by the non-volatile memory device, and a read verification voltage used to discriminate a threshold voltage distribution for the selected memory cell during a program operation performed by the non-volatile memory device.

8. The method of claim 1, wherein the at least one memory cell condition includes; a plurality of temperature ranges extending over a permissible temperature operating range for the non-volatile memory device, the programmed data state for the selected memory cell, and the location of a selected word line in the memory cell array, and
   compensating the operating voltage comprises:
      applying a first compensating shift to the operating voltage in view of a current temperature range among the plurality of temperature ranges that includes the current temperature;

applying a second compensating shift to the operating voltage in view of the programmed state of the selected memory cell; and applying a third compensating shift to the operating voltage in view of the location of the selected word line in the memory cell array.

9. The method of claim 8, wherein the first compensating shift, second compensating shift and third compensating shift are sequentially applied to the operating voltage.

10. The method of claim 8, wherein the first compensating shift, second compensating shift and third compensating shift are simultaneously applied to the operating voltage.

11. A method generating an operating voltage in a memory system comprising a non-volatile memory device including an operating voltage generator, and a memory cell array of non-volatile memory cells, the method comprising:

storing trim information in a trim information region of the memory cell array, wherein the trim information comprises voltage trim information;

upon powering-up the non-volatile memory device and using the trim voltage information, configuring at least one lookup table storing a plurality of compensating offset values;

detecting a current temperature for the non-volatile memory device;

after receiving an access command initiating execution of an access operation by the non-volatile memory device, generating a compensated operating voltage by selecting an offset value from the plurality of compensating offset values stored in the at least one lookup table in response to the current temperature; and performing the access operation using the compensated operating voltage.

12. The method of claim 11, wherein generating the compensated operating voltage comprises:

using the operating voltage generator to generate a nominal operating voltage: and adjusting the nominal operating voltage in response to the selected offset value.

13. The method of claim 12, wherein selecting the offset value from the plurality of compensating offset values comprises:

selecting a first offset value from the plurality of offset values in response to the current temperature, and selecting a second offset value from the plurality of offset values in response to a memory cell condition; and adjusting the nominal operating voltage in response to the selected offset value comprises sequentially adjusting the nominal operating voltage in response to first offset value and the second offset value.

14. The method of claim 13, wherein the memory cell condition is at least one condition selected from a group comprising: a programmed data state for a selected memory cell in the memory cell array, a location of a selected word line associated with the selected memory cell within the memory cell array, page information associated with the selected memory cell, and a location of the selected memory cell within the memory cell array.

15. The method of claim 11, wherein generating the compensated operating voltage comprises:

generating a compensating offset value using the selected offset value; and using the operating voltage generator to generate the compensated operating voltage in response to the compensating offset value.

16. The method of claim 15, wherein generating the compensating offset value comprises:

selecting a first offset value from the plurality of offset values in response to the current temperature;

selecting a second offset value from the plurality of offset values in response to a memory cell condition; and combining the first offset value and the second offset value to generate the compensating offset value.

17. The method of claim 16, wherein the memory cell condition is at least one condition selected from a group comprising: a programmed data state for a selected memory cell in the memory cell array, a location of a selected word line associated with the selected memory cell within the memory cell array, page information associated with the selected memory cell, and a location of the selected memory cell within the memory cell array.

18. The method of claim 11, wherein the at least one lookup table comprises:

a first lookup table storing a plurality first offset values respectively corresponding to a plurality of temperature ranges; and a second lookup table storing a plurality second offset values respectively corresponding to variations in a memory cell condition.

19. The method of claim 18, wherein the memory cell condition is one condition selected from a group consisting of: a programmed data state for a selected memory cell in the memory cell array, a location of a selected word line associated with the selected memory cell within the memory cell array, and a location of the selected memory cell within the memory cell array.

20. A non-volatile memory device comprising:

control logic that controls operation of the non-volatile memory device;

a memory cell array of nonvolatile memory cells; and an operating voltage generator that generates a compensated operating voltage to be applied to a selected memory cell in the memory cell array, wherein the operating voltage generator comprises:

a temperature code generator that detects a current temperature and generates a corresponding temperature code;

a first lookup table that stores a plurality of first offset values that respectively correspond to a plurality of temperature ranges; and a second lookup table that stores a plurality of second offset values that respectively correspond to variations in a memory cell condition, wherein the control logic selects one of the first offset values in response to the temperature code and one of the second offset values in response to a determined variation in the memory cell condition, and the operating voltage generator generates the compensated operating voltage in response to the first offset value and the second offset value.

21. The non-volatile memory device of claim 20, wherein the variations in the memory cell condition respectively correspond to programmed data states for the selected memory cell.

22. The non-volatile memory device of claim 20, wherein the variations in the memory cell condition respectively correspond to locations of at least one word line in the memory cell array associated the selected memory cell.

23. The non-volatile memory device of claim 20, wherein the variations in the memory cell condition respectively correspond to page information associated with the selected memory cell.

24. The non-volatile memory device of claim 20, wherein the variations in the memory cell condition respectively correspond to locations of the selected memory cell within the memory cell array.

25. The non-volatile memory device of claim 20, wherein the operating voltage is one of a read voltage used to discriminate a threshold voltage distribution for the selected memory cell during a read operation performed by the non-volatile memory device, and a read verification voltage used to discriminate a threshold voltage distribution for the selected memory cell during a program operation performed by the non-volatile memory device.

26. The non-volatile memory device of claim 20, wherein the control logic selects the one of the second offset values in further response to the temperature code.

27. A memory card comprising:
at least one non-volatile memory device;
a controller including a buffer memory and configured to control the non-volatile memory device; and
an interface providing an interface between the controller and an external device,
wherein the at least one non-volatile memory device comprises:
control logic that controls operation of the non-volatile memory device;
a memory cell array of nonvolatile memory cells; and
an operating voltage generator that generates a compensated operating voltage to be applied to a selected memory cell in the memory cell array, wherein the operating voltage generator comprises:
a temperature code generator that detects a current temperature and generates a corresponding temperature code;
a first lookup table that stores a plurality of first offset values that respectively correspond to a plurality of temperature ranges; and
a second lookup table that stores a plurality of second offset values that respectively correspond to variations in a memory cell condition,
wherein the control logic selects one of the first offset values in response to the temperature code and one of the second offset values in response to a determined variation in the memory cell condition, and
the operating voltage generator generates the compensated operating voltage in response to the first offset value and the second offset value.

28. A solid state drive (SSD) comprising:
storage media including a plurality of non-volatile memory devices; and
a controller connected with the storage media via a plurality of channels and configured to control the storage media,
wherein at least one of the plurality of non-volatile memory devices comprises:
control logic that controls operation of the non-volatile memory device;
a memory cell array of nonvolatile memory cells; and
an operating voltage generator that generates a compensated operating voltage to be applied to a selected memory cell in the memory cell array, wherein the operating voltage generator comprises:
a temperature code generator that detects a current temperature and generates a corresponding temperature code;
a first lookup table that stores a plurality of first offset values that respectively correspond to a plurality of temperature ranges; and
a second lookup table that stores a plurality of second offset values that respectively correspond to variations in a memory cell condition,
wherein the control logic selects one of the first offset values in response to the temperature code and one of the second offset values in response to a determined variation in the memory cell condition, and
the operating voltage generator generates the compensated operating voltage in response to the first offset value and the second offset value.

29. A method generating an operating voltage in a non-volatile memory device including a memory cell array of non-volatile memory cells, the method comprising:
detecting a programmed data state of a selected memory cell in the memory cell array;
generating the operating voltage to be applied to the selected memory cell; and
compensating the operating voltage in response to a read voltage level corresponding to the programmed data state of the selected memory cell.

30. A method generating an operating voltage in a non-volatile memory device including a memory cell array of non-volatile memory cells, the method comprising:
detecting a location of a selected word line in the memory cell array;
generating the operating voltage to be applied to the selected word line; and
compensating the operating voltage in response to the location of the selected word line.

31. A method generating an operating voltage in a non-volatile memory device including a memory cell array of non-volatile memory cells, the method comprising:
detecting a programmed data state of a selected memory cell in the memory cell array;
generating a read voltage to be applied to a selected word line associated with the selected memory cell in the memory cell array; and
compensating the read voltage in response to a read voltage level corresponding to the programmed data state of the selected memory cell.

* * * * *